United States Patent
Bright et al.

(10) Patent No.: US 9,481,927 B2
(45) Date of Patent: *Nov. 1, 2016

(54) METHOD OF MAKING INORGANIC OR INORGANIC/ORGANIC HYBRID BARRIER FILMS

(75) Inventors: Clark I. Bright, Tucson, AZ (US); Christopher S. Lyons, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 116 days.

This patent is subject to a terminal disclaimer.

(21) Appl. No.: 12/996,062

(22) PCT Filed: Jun. 29, 2009

(86) PCT No.: PCT/US2009/048996
§ 371 (c)(1), (2), (4) Date: Dec. 3, 2010

(87) PCT Pub. No.: WO2010/002755
PCT Pub. Date: Jan. 7, 2010

(65) Prior Publication Data
US 2011/0081502 A1    Apr. 7, 2011

Related U.S. Application Data

(60) Provisional application No. 61/077,002, filed on Jun. 30, 2008.

(51) Int. Cl.
*C23C 14/12* (2006.01)
*B05D 1/00* (2006.01)
*C23C 14/02* (2006.01)
*C23C 14/58* (2006.01)
(Continued)

(52) U.S. Cl.
CPC ............... *C23C 14/12* (2013.01); *B05D 1/60* (2013.01); *C23C 14/02* (2013.01); *C23C 14/5853* (2013.01); *B05D 3/0254* (2013.01); *B05D 3/145* (2013.01)

(58) Field of Classification Search
USPC .............. 346/135.1; 205/201; 118/718
See application file for complete search history.

(56) References Cited

U.S. PATENT DOCUMENTS 2,621,193 A   12/1952  Langkammerer
3,529,074 A    9/1970  Lewis
(Continued)

FOREIGN PATENT DOCUMENTS

EP   0 777 280   6/1997
EP   0 915 105   5/1999
(Continued)

OTHER PUBLICATIONS

Water Phase Diagram, retrieved at http://www.google.com/imgres?q=water+phase+diagram&um=1&hl=en&sa=N&rls=com.microsoft:en-us:IE-SearchBox&biw=1280&bih=780&tbm=isch&tbnid=LrPZGF7XrP4EgM:&imgrefurl=http://www.answers.com/topic/phase-diagram&docid=GdPui1u65vFLEM&imgurl=http://wpcontent.answcdn.com/wikipedia/commons/thumb/0/08/Phase_diagram_of_.*
(Continued)

*Primary Examiner* — David Turocy
*Assistant Examiner* — Mohammad Mayy
(74) *Attorney, Agent, or Firm* — James A. Baker

(57) ABSTRACT

A method for forming an inorganic or hybrid organic/inorganic barrier layer on a substrate, comprising condensing a vaporized metal alkoxide to form a layer atop the substrate, and contacting the condensed metal alkoxide layer with water to cure the layer is provided.

19 Claims, 4 Drawing Sheets

(51) Int. Cl.
*B05D 3/02* (2006.01)
*B05D 3/14* (2006.01)

(56) References Cited

U.S. PATENT DOCUMENTS

| | | | |
|---|---|---|---|
| 4,435,476 A * | 3/1984 | Phillips | B05D 3/148 427/525 |
| 4,537,814 A | 8/1985 | Itoh et al. | |
| 4,626,448 A * | 12/1986 | Hays | C23C 16/18 204/164 |
| 4,629,756 A | 12/1986 | Kerbow | |
| 4,645,714 A | 2/1987 | Roche et al. | |
| 4,696,719 A | 9/1987 | Bischoff | |
| 4,722,515 A | 2/1988 | Ham | |
| 4,732,879 A | 3/1988 | Kalinowski et al. | |
| 4,782,216 A | 11/1988 | Woodard | |
| 4,786,783 A | 11/1988 | Woodard | |
| 4,842,893 A | 6/1989 | Yializis et al. | |
| 4,954,371 A | 9/1990 | Yializis | |
| 5,018,048 A | 5/1991 | Shaw et al. | |
| 5,032,461 A | 7/1991 | Shaw et al. | |
| 5,097,800 A | 3/1992 | Shaw et al. | |
| 5,104,929 A | 4/1992 | Bilkadi | |
| 5,125,138 A | 6/1992 | Shaw et al. | |
| 5,130,166 A * | 7/1992 | Spencer | 427/337 |
| 5,224,441 A * | 7/1993 | Felts | B05D 3/141 118/718 |
| 5,227,199 A * | 7/1993 | Hazlebeck et al. | 427/376.2 |
| 5,260,095 A | 11/1993 | Affinito | |
| 5,324,374 A | 6/1994 | Harmand et al. | |
| 5,332,888 A | 7/1994 | Tausch et al. | |
| 5,356,947 A | 10/1994 | Ali et al. | |
| 5,395,644 A | 3/1995 | Affinito | |
| 5,409,683 A | 4/1995 | Tillotson et al. | |
| 5,440,446 A | 8/1995 | Shaw et al. | |
| 5,464,667 A | 11/1995 | Kohler et al. | |
| 5,530,581 A | 6/1996 | Cogan | |
| 5,547,508 A | 8/1996 | Affinito | |
| 5,681,666 A | 10/1997 | Treger et al. | |
| 5,686,360 A | 11/1997 | Harvey, III et al. | |
| 5,725,909 A * | 3/1998 | Shaw et al. | 427/412.1 |
| 5,736,207 A | 4/1998 | Walther et al. | |
| 5,773,102 A | 6/1998 | Rehfeld | |
| 5,858,526 A | 1/1999 | Floch et al. | |
| 5,925,438 A | 7/1999 | Ota et al. | |
| 5,991,081 A | 11/1999 | Haaland et al. | |
| 6,004,660 A | 12/1999 | Topolski et al. | |
| 6,022,812 A | 2/2000 | Smith et al. | |
| 6,045,864 A * | 4/2000 | Lyons et al. | 427/255.23 |
| 6,083,628 A | 7/2000 | Yializis | |
| 6,132,882 A | 10/2000 | Landin et al. | |
| 6,146,225 A | 11/2000 | Sheats et al. | |
| 6,214,422 B1 | 4/2001 | Yializis | |
| 6,224,948 B1 | 5/2001 | Affinito | |
| 6,228,796 B1 * | 5/2001 | Arakawa et al. | 502/159 |
| 6,231,939 B1 | 5/2001 | Shaw et al. | |
| 6,268,694 B1 | 7/2001 | Fujimoto | |
| 6,268,695 B1 | 7/2001 | Affinito | |
| 6,288,842 B1 | 9/2001 | Florczak et al. | |
| 6,335,479 B1 | 1/2002 | Yamada et al. | |
| 6,348,237 B2 | 2/2002 | Kohler et al. | |
| 6,352,761 B1 | 3/2002 | Hebrink et al. | |
| 6,358,570 B1 | 3/2002 | Affinito | |
| 6,368,699 B1 | 4/2002 | Gilbert et al. | |
| 6,413,645 B1 | 7/2002 | Graff et al. | |
| 6,492,026 B1 | 12/2002 | Graff et al. | |
| 6,497,598 B2 | 12/2002 | Affinito | |
| 6,570,325 B2 | 5/2003 | Graff et al. | |
| 6,573,652 B1 | 6/2003 | Graff et al. | |
| 6,613,088 B1 | 9/2003 | Babizhayev | |
| 6,623,861 B2 | 9/2003 | Martin et al. | |
| 6,627,267 B2 | 9/2003 | Affinito | |
| 6,641,874 B2 | 11/2003 | Kuntz et al. | |
| 6,660,339 B1 | 12/2003 | Datta et al. | |
| 6,720,203 B2 | 4/2004 | Carcia et al. | |
| 6,743,488 B2 | 6/2004 | Memarian et al. | |
| 6,743,948 B1 | 6/2004 | Hosokawa et al. | |
| 6,765,351 B2 | 7/2004 | Forrest et al. | |
| 6,797,396 B1 | 9/2004 | Liu et al. | |
| 6,811,867 B1 | 11/2004 | McGurran et al. | |
| 6,830,713 B2 | 12/2004 | Hebrink et al. | |
| 6,867,539 B1 | 3/2005 | McCormick et al. | |
| 6,888,305 B2 | 5/2005 | Weaver | |
| 6,929,864 B2 | 8/2005 | Fleming et al. | |
| 6,936,131 B2 | 8/2005 | McCormick et al. | |
| 6,975,067 B2 | 12/2005 | McCormick et al. | |
| 6,991,826 B2 | 1/2006 | Pellerite et al. | |
| 7,015,640 B2 | 3/2006 | Schaepkens et al. | |
| 7,018,713 B2 | 3/2006 | Padiyath et al. | |
| 7,189,447 B2 | 3/2007 | Conway et al. | |
| 7,215,473 B2 | 5/2007 | Fleming | |
| 7,410,261 B2 | 8/2008 | Magarill | |
| 7,486,019 B2 | 2/2009 | Padiyath et al. | |
| RE40,787 E | 6/2009 | Martin et al. | |
| 2002/0022156 A1 | 2/2002 | Bright | |
| 2002/0176993 A1 | 11/2002 | Graff et al. | |
| 2003/0008072 A1 | 1/2003 | Lee et al. | |
| 2003/0108749 A1 | 6/2003 | Ram | |
| 2003/0148128 A1 | 8/2003 | Tomaru et al. | |
| 2003/0213967 A1 | 11/2003 | Forrest et al. | |
| 2004/0018305 A1 | 1/2004 | Pagano et al. | |
| 2004/0032658 A1 | 2/2004 | Fleming | |
| 2004/0107905 A1 | 6/2004 | Sheu | |
| 2004/0114101 A1 | 6/2004 | Thakrar | |
| 2004/0121146 A1 | 6/2004 | He et al. | |
| 2004/0121167 A1 * | 6/2004 | Iacovangelo | C03C 17/009 428/447 |
| 2004/0151918 A9 * | 8/2004 | Mitsuishi et al. | 428/447 |
| 2004/0238817 A1 * | 12/2004 | Klemperer et al. | 257/43 |
| 2005/0089673 A1 | 4/2005 | Fleming et al. | |
| 2005/0112378 A1 | 5/2005 | Naruse et al. | |
| 2006/0087230 A1 | 4/2006 | Ghosh et al. | |
| 2006/0099725 A1 | 5/2006 | Shioya et al. | |
| 2006/0199014 A1 | 9/2006 | Il et al. | |
| 2007/0020451 A1 | 1/2007 | Padiyath et al. | |
| 2007/0084381 A1 | 4/2007 | Sanbayashi et al. | |
| 2007/0216292 A1 * | 9/2007 | Seo et al. | 313/506 |
| 2007/0228914 A1 * | 10/2007 | Kim et al. | 313/111 |
| 2007/0231484 A1 | 10/2007 | Hishiya et al. | |
| 2008/0196664 A1 | 8/2008 | David et al. | |
| 2008/0292810 A1 | 11/2008 | Anderson et al. | |
| 2010/0068542 A1 * | 3/2010 | Bright et al. | 428/480 |
| 2010/0073936 A1 | 3/2010 | Padiyath et al. | |
| 2011/0229637 A1 | 9/2011 | Yasui et al. | |
| 2012/0003448 A1 | 1/2012 | Weigel et al. | |
| 2012/0003451 A1 | 1/2012 | Weigel et al. | |

FOREIGN PATENT DOCUMENTS

| | | |
|---|---|---|
| EP | 1 555 687 | 7/2005 |
| EP | 1 645 657 | 4/2006 |
| JP | 1-283136 | 11/1989 |
| JP | 4-14440 | 1/1992 |
| JP | 6-316728 | 11/1994 |
| JP | 11-255923 | 9/1999 |
| JP | 2002-205354 | 7/2002 |
| JP | 2002-520813 | 7/2002 |
| JP | 2002-532850 | 10/2002 |
| JP | 2003-53881 | 2/2003 |
| JP | 2004-351834 | 12/2004 |
| JP | 2005-60817 | 3/2005 |
| JP | 2005-104994 | 4/2005 |
| JP | 2006-56007 | 3/2006 |
| JP | 2007-81350 | 3/2007 |
| JP | 2007-210208 A | 8/2007 |
| JP | 2007-220402 | 8/2007 |
| JP | 2011-526833 | 10/2011 |
| JP | 5576125 | 7/2014 |
| WO | WO 93/06258 | 4/1993 |
| WO | WO 97/16053 | 5/1997 |
| WO | WO 00/02241 | 1/2000 |
| WO | WO 00/26973 | 5/2000 |
| WO | WO 00/36665 | 6/2000 |
| WO | WO 01/03856 | 1/2001 |

(56) References Cited

FOREIGN PATENT DOCUMENTS

| | | |
|---|---|---|
| WO | WO 01/16044 | 3/2001 |
| WO | WO 01/58989 | 8/2001 |
| WO | WO 01/96115 | 12/2001 |
| WO | WO 02/090107 | 11/2002 |
| WO | WO 03/016589 | 2/2003 |
| WO | WO 2004/016560 | 2/2004 |
| WO | WO 2004/017701 | 2/2004 |
| WO | WO 2006/093702 | 9/2006 |
| WO | WO 2007/084386 | 7/2007 |
| WO | WO 2007/087281 | 8/2007 |
| WO | WO 2007/140425 | 12/2007 |
| WO | WO 2007/149683 | 12/2007 |
| WO | WO 2008/027863 | 3/2008 |
| WO | WO 2008/083304 | 7/2008 |
| WO | WO 2008/083310 | 7/2008 |

OTHER PUBLICATIONS

NPL, Inorganic and Organometallic Polymers. Ronald D. Archer, 2001 Wiley-VCH, Inc.*

"Polymethyl Methacrylate"—Wikipedia (last edited Jun. 29, 2011) (printed Jun. 30, 2011).

Stupl et al., "High Energy Lasers: A Sensible Choice for Future Weapon Systems?", Security Challenges, vol. 1, No. 1, 2005, pp. 135-153.

Affinito et al., "Polymer-Oxide Transparent Barrier Layers", Society of Vacuum Coaters 39th Annual Technical Conference Proceedings, Paper No. W-12, (1996), pp. 1-6.

Affinito et al., "Vacuum Deposited Polymer/Metal Multilayer Films for Optical Application", *Thin Solid Films* 270, (1995), pp. 43-48.

Bradley et al., "The Hydrolysis of Titanium Tetraethoxide", *J. Chem. Soc.*, (1955), pp. 721-726.

Bradley et al., "Structural Aspects of the Hydrolysis of Titanium Tetraethoxide", *J. Chem. Soc.*, (1955), pp. 3977-3982.

Bright et al., "Advances in Vacuum Web Coating", AIMCAL Fall Technical Conference Proceedings (1999), Abstract, 1 page.

Bright et al., "New Applications for Polymer Multi-Layer Technology", AIMCAL Fall Technical Conference Proceedings (1998), Abstract, 1 page.

Bright et al., "Transparent Barrier Coatings Based on ITO for Flexible Plastic Displays", Proceedings of the Thirteenth International Conference on Vacuum Web Coatings (1999), Abstract, 18 pages.

Bright et al., "Transparent and Conductive Ultra-barrier Coatings for Flexible Plastic Displays", American Vacuum Society, 46th International Symposium, Conference Proceedings (1999).

Brochure, DuPont™ Tyzor® Organic Titanates and Zirconates, (2008).

Jone et al., "An Improved Metallized Film Capacitor Using a New Acrylate Coating Process", Journal of Plastic Film & Sheeting, vol. 13, Apr. 1997, pp. 150-158.

Karmakar et al., "Alkoxide Hydrolysis and Preparation of $TiO_2$ Powders", *Transactions of the Indian Ceramic Society*, 44 (1), (1985), pp. 10-14.

Liu et al., "Fundamental studies of a new hybrid (inorganic-organic) positively charged membrane. II. Membrane preparation via alcoholysis reaction and amination processes of silicone and titanate coupling agents", *Journal of Membrane Science* 264 (2005), pp. 87-96.

Roehrig et al., "Use of Evaporated Acrylate Coatings to Smooth the Surface of Polyester and Polypropylene Film Substrates", *Journal of Plastic Film & Sheeting*, vol. 13, (1997), pp. 235-251.

Roehrig et al., "Vacuum Heat Transfer Models for Web Substrates: Review of Theory and Experimental Heat Transfer Data", *2000 Society of Vacuum Coaters*, 43rd Annual Technical Conference Proceedings, Apr. 2000, pp. 335-341.

Shaw et al., "A New High Speed Process for Vapor Depositing Acrylate Thin Films: An Update", Society of Vacuum Coaters 36th Annual Technical Conference Proceedings, (1993), pp. 348-352.

Shaw et al., "A New Vapor Deposition Process for Coating Paper and Polymer Webs", 6th International Vacuum Coating Conference, (1992), pp. 96-101.

Shaw et al., "Use of Vapor Deposited Acrylate Coatings to Improve the Barrier Properties of Metallized Film", Society of Vacuum Coaters 37th Annual Technical Conference Proceeding (1994), pp. 240-247.

D'Agostino, Plasma Deposition, Treatment, and Etching of Polymers, 1990 by Academic Press, Inc., p. 187.

Chapman, Glow Discharge Processes Sputtering and Plasma Etching, 1980 by John Wiley & Sons, Inc., Chapter 3, p. 49.

Lieberman, Principles of Plasma Discharges and Materials Processing, Second Edition, 2005 by John Wiley & Sons, pp. 8-10.

\* cited by examiner

METHOD OF MAKING INORGANIC OR INORGANIC/ORGANIC HYBRID BARRIER FILMS

CROSS REFERENCE TO RELATED APPLICATIONS

This application is a national stage filing under 35 U.S.C. 371 of PCT/US2009/048996, filed Jun. 29, 2009, which claims benefit of U.S. Provisional Patent Application No. 61/077,002, filed Jun. 30, 2008, the disclosure of which is incorporated by reference in its/their entirety herein.

FIELD

This invention relates to a method for manufacturing thin inorganic or hybrid inorganic/organic barrier films.

BACKGROUND

Inorganic or hybrid inorganic/organic layers have been used in thin films for electrical, packaging and decorative applications. These layers can provide desired properties such as mechanical strength, thermal resistance, chemical resistance, abrasion resistance, moisture barriers, and oxygen barriers.

Inorganic or hybrid films can be prepared by a variety of production methods. These methods include liquid coating techniques such as solution coating, roll coating, dip coating, spray coating, spin coating, and dry coating techniques such as Chemical Vapor Deposition (CVD), Plasma Enhanced Chemical Vapor Deposition (PECVD), sputtering and vacuum processes for thermal evaporation of solid materials. Each of these methods has limitations.

Chemical vapor deposition methods (CVD and PECVD) form vaporized metal alkoxide precursors that undergo a reaction, when adsorbed on a substrate, to form inorganic coatings. These processes are limited to low deposition rates (and consequently low line speeds), and make inefficient use of the alkoxide precursor (much of the alkoxide vapor is not incorporated into the coating). The CVD process also requires high substrate temperatures, often in the range of 300-500° C., which may not be suitable for polymer substrates.

Sputtering has also been used to form metal oxide layers. This process is characterized by slow deposition rates allowing web speeds of just a few feet/min. Another characteristic of the sputtering process is its very low material utilization, because a major part of the solid sputtering target material does not become incorporated in the coating. The slow deposition rate, coupled with the high equipment cost, low utilization of materials, and very high energy consumption, makes it expensive to manufacture films by sputtering.

Vacuum processes such as thermal evaporation of solid materials (e.g., resistive heating or electron-beam (e-beam) heating) also provide low metal oxide deposition rates. Thermal evaporation is difficult to scale up for roll wide web applications requiring very uniform coatings (e.g., optical coatings) and can require substrate heating to obtain quality coatings. Additionally, evaporation/sublimation processes can require ion-assist, which is generally limited to small areas, to improve the coating quality.

There remains a need for a method to prepare inorganic or hybrid inorganic/organic barrier films on polymeric substrates that can be performed rapidly and at low cost.

SUMMARY OF THE INVENTION

The present invention provides, in one aspect, a method for forming an inorganic or hybrid organic/inorganic barrier layer on a substrate, which method comprises forming a first metal alkoxide layer atop the substrate, contacting the first metal alkoxide layer with water to cure the layer, wherein the inorganic or hybrid organic/inorganic layer is formed under vacuum.

In a second aspect, the invention provides, in one aspect, a method for forming an inorganic or hybrid organic/inorganic barrier layer on a substrate, which method comprises condensing a vaporized metal alkoxide to form a layer atop the substrate, and contacting the condensed metal alkoxide layer with water to cure the layer.

In a third aspect, the invention provides a method for forming a barrier film comprising a hybrid organic/inorganic layer on a substrate, which method comprises forming a layer comprising a metal alkoxide and a organic compound to form a first hybrid layer atop the substrate, curing the hybrid layer, wherein the hybrid layer is formed under vacuum.

In a fourth aspect, the invention provides a method for forming a hybrid organic/inorganic layer on a substrate, which method comprises condensing a vaporized metal alkoxide and a vaporized organic compound to form a layer atop the substrate, and contacting the condensed metal alkoxide layer with water to cure the layer.

In a fifth aspect, the invention provides a method for forming an inorganic or hybrid organic/inorganic layer on a substrate, which method comprises vaporizing a metal alkoxide or a metal alkoxide and an organic compound, passing the evaporate proximate a glow discharge electrode to form a plasma, and condensing the material from the plasma to form a layer atop the substrate. The plasma can contain water or the condensed layer can be contacted with water to cure the layer.

In a another aspect, the invention provides a method for forming a hybrid organic/inorganic layer on a substrate, where the metal alkoxide or a metal alkoxide pre-polymer, which has been partially hydrolyzed, forms a layer atop the substrate while still in the liquid state. The layer is cured by contacting water or by radiation, by heating or other chemical means or by a combination of these means.

In another aspect, the invention provides a method for preparing inorganic or hybrid inorganic/organic barrier films on polymeric substrates which can exhibit optical functionality.

These and other aspects of the invention will be apparent from the accompanying drawing and this specification. In no event, however, should the above summaries be construed as limitations on the claimed subject matter, which subject matter is defined solely by the attached claims, as may be amended during prosecution.

DETAILED DESCRIPTION

Figure 1:
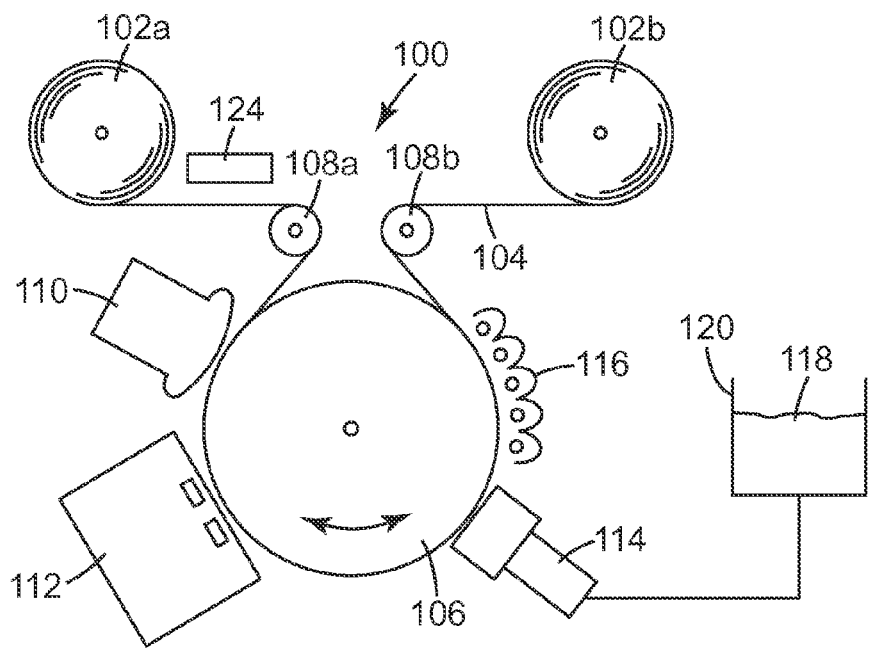
FIG. 1 is a schematic representation of a roll-to-roll apparatus suitable for carrying out the disclosed method.

The words "a", "an", and "the" are used interchangeably with "at least one" to mean one or more of the elements being described. By using words of orientation such as "atop", "on", "covering", "uppermost", "underlying" and the like for the location of various elements in the disclosed coated articles, we refer to the relative position of an element with respect to a horizontally-disposed, upwardly-facing substrate. It is not intended that the substrate or articles should have any particular orientation in space during or after manufacture.

The term "polymer" includes homopolymers and copolymers, as well as homopolymers or copolymers that may be formed in a miscible blend, e.g., by coextrusion or by reaction, including, e.g., transesterification. The term "copolymer" includes both random and block copolymers.

The term "barrier film" or "barrier layer" refers to a film or layer which is designed to impair or limit vapor, gas or aroma migration or transmission through the film or layer. Exemplary gases and vapors that may have their transmission impaired include oxygen or water vapor.

The term "crosslinked" polymer refers to a polymer in which the polymer chains are joined together by covalent chemical bonds, usually via crosslinking molecules or groups, to form a network polymer. A crosslinked polymer is generally characterized by insolubility, but may be swellable in the presence of an appropriate solvent.

The term "water" refers to water vapor, liquid water (e.g., a mist), water adsorbed or absorbed by the substrate or the layer. The water can be provided by any suitable source, e.g., a vaporizer, a plasma containing water vapor, a catalytic combustion burner, or the like.

The term "under vacuum" refers to conditions where the air (gas) pressure surrounding the substrate has been reduced below atmospheric pressure. Preferably under vacuum refers to a pressure of less than 10 Torr, and more preferably less than 1 Torr.

The term "cure" refers to a process that causes a chemical change, e.g., a reaction via consumption of water, to solidify a film layer or increase its viscosity.

The term "metal" includes a pure metal or a metal alloy.

The terms "optical functionality" or "optically functional" or "optical function" refer to providing a desirable optical property, or reducing or eliminating an undesirable optical property in a substrate with a disclosed hybrid organic/inorganic layer.

The term "optically clear" refers to an article in which there is no visibly noticeable distortion, haze or flaws as detected by the naked eye at a distance of about 1 meter, preferably about 0.5 meters.

The term "optical thickness" when used with respect to a layer refers to the physical thickness of the layer times its in-plane index of refraction. In some optical designs a preferred optical thickness is about ¼ the wavelength of the center of the desired waveband for transmitted or reflected light.

A variety of substrates can be employed. In one embodiment, the substrates are light-transmissive and can have a visible light transmission of at least about 50% at 550 nm. Exemplary substrates are rigid or flexible plastic materials including thermoplastics such as polyesters (e.g., poly(ethylene terephthalate) (PET) or poly(ethylene naphthalates)), polyacrylates (e.g., poly(methyl methacrylate)), polycarbonates, polypropylenes, high or low density polyethylenes, polysulfones, poly(ether sulfones), polyurethanes, polyamides, poly(vinyl butyral), poly(vinyl chloride), fluoropolymers (e.g., poly(vinylidene difluoride) and polytetrafluoroethylene), poly(ethylene sulfide), and thermoset materials such as epoxies, cellulose derivatives, polyimide, poly(imide benzoxazole) and polybenzoxazole. The substrate can also be a multilayer optical film ("MOF"), such as those described in U.S. Pat. No. 7,215,473.

In one embodiment, the disclosed films can be prepared on a substrate including PET. The substrate may have a variety of thicknesses, e.g., about 0.01 to about 1 mm. The substrate may however be considerably thicker, for example, when a self-supporting article is desired. Such articles can conveniently also be made by laminating or otherwise joining a disclosed film made using a flexible substrate to a thicker, inflexible or less flexible supplemental support.

The disclosed methods can enable the formation of barrier films on one or both substrate surfaces and two or more coated substrates may be laminated together using know methods, e.g., pressure sensitive adhesives. Further, the adhesive may have barrier properties.

The disclosed methods can enable the formation of barrier films that exhibit superior mechanical properties such as elasticity and flexibility yet still have low oxygen or water vapor transmission rates. The films have at least one inorganic or hybrid organic/inorganic layer or can have additional inorganic or hybrid organic/inorganic layers. In one embodiment, the disclosed films can have inorganic or hybrid layers alternating with organic compound, e.g., polymer layers. In another embodiment, the films can have a film that includes an inorganic or hybrid material and an organic compound. In yet another embodiment, the disclosed films can have inorganic layers alternating with hybrid organic/inorganic layers. Substrates having a barrier film formed using the disclosed methods can have an oxygen transmission rate (OTR) at ambient pressure, less than about 1 cc/m$^2$-day, less than about 0.5 cc/m$^2$-day, or less than about 0.1 cc/m$^2$-day. Substrates having a barrier film formed using the disclosed methods can have a water vapor transmission rate (WVTR) at ambient pressure, less than about 10 g/m$^2$-day, less than about 5 g/m$^2$-day, or less than about 1 g/m$^2$-day.

Suitable metal alkoxides for forming a layer on a substrate are compounds that can be volatilized and condensed on the substrate, can be volatilized to form a plasma and condensed on the substrate, or can be coated, in the liquid state, on the substrate. After condensation or coating, the alkoxides can be cured via reaction with water to form a barrier film. Exemplary metal alkoxide compounds can have the general formula $R^1_x M$—$(OR^2)_{y-x}$ where each $R^1$ is independently $C_1$-$C_{20}$alkyl, $(C_3$-$C_8)$cycloalkyl, $(C_2$-$C_7)$-heterocycle, $(C_2$-$C_7)$heterocycle$(C_1$-$C_8)$alkylene-, $(C_6$-$C_{10})$aryl, $(C_6$-$C_{10})$aryl-$(C_1$-$C_8)$-alkylene-, $(C_5$-$C_9)$heteroaryl, or $(C_5$-$C_9)$heteroaryl$(C_1$-$C_8)$alkylene-, and each $R^2$ is independently $(C_1$-$C_6)$alkyl, or $(C_2$-$C_6)$alkenyl, optionally substituted with hydroxyl or oxo, or two $OR^2$ groups can form a ring together with the atom to which they are attached.

The $R^1$ groups can be optionally substituted with one or more substituent groups, wherein each substituent is independently $(C_1$-$C_4)$alkyl, oxo, halo, —$OR^a$, —$SR^a$, cyano, nitro, trifluoromethyl, trifluoromethoxy, $(C_3$-$C_8)$cycloalkyl, $(C_2$-$C_7)$heterocycle or $(C_2$-$C_7)$heterocycle $(C_1$-$C_8)$alkylene-, $(C_6$-$C_{10})$aryl, $(C_6$-$C_{10})$aryl$(C_1$-$C_8)$alkylene-, $(C_5$-$C_9)$heteroaryl, $(C_5$-$C_9)$heteroaryl$(C_1$-$C_8)$alkylene-, —$CO_2R^a$, $R^aC$ (=O)O—, R$^a$C(=O)—, —OCO$_2$R$^a$, R$^b$R$^c$NC(=O)O—, R$^a$OC(=O)N(R$^b$)—, R$^b$R$^c$N—, R$^b$R$^c$NC(=O)—, R$^a$C(=O)N(R$^b$)—, R$^b$R$^c$NC(=O)N(R$^b$)—, R$^b$R$^c$NC(=S)N(R$^b$)—, —OPO$_3$R$^a$, R$^a$OC(=S)—, R$^a$C(=S)—, —SSR$^a$, R$^a$S(=O)—, —NNR$^b$, —OPO$_2$R$^a$, or two R$^1$ groups can form a ring together with the atom to which they are attached. Each R$^a$, R$^b$ and R$^c$ is independently hydrogen, (C$_1$-C$_8$)alkyl, or substituted (C$_1$-C$_8$)alkyl wherein the substituents include 1, 2, or 3 (C$_1$-C$_8$)alkoxy, (C$_3$-C$_8$)cycloalkyl, (C$_1$-C$_8$)alkylthio, amino, aryl, or aryl(C$_1$-C$_8$)alkylene, or R$^b$ and R$^c$, can form a ring together with the nitrogen atom to which they are attached. Exemplary rings include pyrrolidino, piperidino, morpholino, or thiomorpholino. Exemplary halo groups include fluoro, chloro, or bromo. The R$^1$ and R$^2$ alkyl groups can be straight or branched chains. M represents a metal, x is 0, 1, 2, 3, 4, or 5, and y is the valence number of the metal, e.g., y can be 3 for aluminum, 4 for titanium and zirconium, and may vary depending upon the oxidation state of the metal, provided that y−x≥1, e.g., there must be at least one alkoxy group bonded to the metal atom.

Exemplary metals include aluminum, antimony, arsenic, barium, bismuth, boron, cerium, gadolinium, gallium, germanium, hafnium, indium, iron, lanthanum, lithium, magnesium, molybdenum, neodymium, phosphorus, silicon, sodium, strontium, tantalum, thallium, tin, titanium, tungsten, vanadium, yttrium, zinc, and zirconium, or a mixture thereof. Several metal alkoxides, e.g., organic titanates and zirconates, are available from DuPont Co. under the Tyzor™ trademark.

Non-limiting examples of specific metal alkoxides include tetra(methoxy) titanate, tetra(ethoxy) titanate, tetra(isopropoxy) titanate, tetra(n-propoxy)titanate, tetra(butoxy) titanate, 2-ethylhexyloxy titanate, octylene glycol titanate, poly(n-butoxy) titanate, triethanolamine titanate, n-butyl zirconate, n-propyl zirconate, titanium acetyl acetonate, ethyl acetoacetic ester titanate, isostearoyl titanate, titanium lactate, zirconium lactate, zirconium glycolate, methyltriacetoxy silane, fluorinated silanes (e.g., such as fluorinated polyether silanes disclosed in U.S. Pat. No. 6,991,826), tetra(n-propoxy) zirconate, and mixtures thereof. Additional examples include vaporizable prepolymerized forms of the above metal alkoxides including dimers, trimers, and longer oligomers including polydimethoxysiloxane and polybutyl titanate. Additional metal alkoxides include methoxy, ethoxy, n-propoxy, butoxy, acetoxy, and isopropoxy functionalized metal atoms, and prepolymerized forms of those metal alkoxides, e.g., poly(n-butoxy titanate). Other metal alkoxides that can be polymerized include tetra(ethoxy) titanate, tetra(n-propoxy) titanate, tetra(isopropoxy) titanate, methyltriacetoxy silane, fluorinated silanes, polydimethoxy silane, and tetra(n-propoxy) zirconate.

The prepolymerized metal alkoxide coating materials can be prepared using the techniques known in the art, as described in the DuPont literature for Tyzor materials "*DuPont™ Tyzor Organic Titanates General Brochure*", Website http://www.dupont.com/tyzor; in D. C. Bradley, et. al, "*The Hydrolysis of Titanium Tetraethoxide*", *J. Chem. Soc.* (1955) 721-726; in D. C. Bradley, et. al, "*Structural Aspects of the Hydrolysis of Titanium Tetraethoxide*", *J. Chem. Soc.* (1955) 3977-3982; and in B. Karmakar and D. Banguli, "*Alkoxide Hydrolysis and Preparation of TiO2 Powders*", *Trans. Indian Ceramic Soc.*, 44, (1985) 10-14. The metal alkoxide is mixed with its alcohol as a solvent. By cautious addition of water (typically in dilute alcoholic solution), the polymerization process can be controlled. It is important that the ratio of moles water/moles metal alkoxide be controlled, generally held to values less than about 1.

Prepolymerized metal alkoxide coating materials (oligomers) can also be prepared by reaction with various organic molecules. Titanium tetraalkoxides can be reacted with carboxylic acids and heat to form alkoxy polytitanyl acrylates, as described in "DuPont™ Tyzor Organic Titanates General Brochure", Website http://www.dupont.com/tyzor; and in U.S. Pat. No. 2,621,193.

The increase in molecular weight in the prepolymerized precursors (oligomers) can lead to increased viscosity and reduced vapor pressure relative to the unpolymerized metal alkoxide. A controlled amount of solvent can be retained in the prepolymerized precursor to hold the solution at the desired viscosity for coating purposes. When using atomization and flash evaporation to form a vapor flow for coating, the presence of 5-70% solvent can facilitate the atomization and evaporation of the prepolymerized metal alkoxide.

The metal alkoxides can be vaporized using a variety of methods known in the art. Exemplary methods include evaporation, e.g., flash evaporation, using techniques like those disclosed in U.S. Pat. Nos. 4,954,371, 6,045,864, 6,224,948 and 6,627,267, sublimation, and the like. Carrier gas flows (optionally heated) may be added to the evaporator to reduce the partial pressure of the metal alkoxide vapor or to increase the evaporation rate. The alkoxide may be condensed onto the substrate at a temperature below the condensation point of the vapor stream.

The metal alkoxides also can be applied using a variety of coating methods known in the art. Exemplary methods include coating techniques such as spray coating, Chemical Vapor Deposition (CVD), Plasma Enhanced Chemical Vapor Deposition (PECVD), and techniques disclosed in U.S. Pat. Nos. 5,260,095, 5,395,644 and 5,547,508, and the like. Optionally, the metal alkoxide can be mixed with additional materials prior to the deposition by liquid coating techniques. These additional materials serve the functions of improving the coatability of the liquid in vacuum. These additional materials can modify the solution viscosity, density, or surface tension. These additional materials can modify the rate of the curing reactions or the final thickness of the cured coating. In some cases, these additional materials behave like a low vapor pressure solvent, assisting in the deposition of the liquid metal alkoxide by liquid coating techniques and evaporating from the coating during the curing process. Examples of these additional materials include low vapor pressure alkanes and alcohols, including the series from dodecane to octadecane, and the corresponding alcohol series from dodecanol to octadecanol.

The condensed alkoxide layer is cured by contacting the layer with water. For example, the layer can be contacted with water vapor, liquid water, water adsorbed or absorbed by the substrate the layer, or a plasma containing water vapor. Curing can be enhanced with heat. Heat can be provided using any suitable source, e.g., an infra red heater or a catalytic combustion burner. The catalytic combustion burner can also provide water vapor. Additional energy can be provided by ultraviolet (UV) or vacuum UV light input into the plasma or the condensed alkoxide layer during the curing process.

The curing reactions may be accelerated with vaporizable catalysts. Exemplary catalysts include organic acids such as acetic acid and methane sulfonic acid, photoacid generators such as triphenyl sulfonium and diphenyl iodonium compounds, or basic materials such as ammonia and photobase generators. Photoactive catalysts can be activated by exposure to UV light. The catalyst can condense into the coating layer or adsorb on the surface to promote the curing reactions.

In another embodiment, a metal alkoxide and an organic compound can be vaporized, condensed on the substrate, and cured. In one embodiment, the curing can include contacting the layer with water. Curing can involve reaction of the alkoxide with water to solidify the film layer or increase its viscosity together with polymerization of the organic compound to form an intermixed film layer. Curing can also be conducted in sequential steps. The components of the layer can be pre-reacted to form a liquid coatable pre-polymer or a volatilizable oligomer prior to deposition. Curing can also include reaction of the components of the layer (alkoxide and organic compound) together with or without water to form an organometallic copolymer. The films prepared having an organometallic copolymer may be designed to exhibit barrier properties not obtained when the films are prepared by separate deposition and curing of the two components.

The organic compounds can be vaporized using any methods like those described above for vaporizing the metal alkoxide. The alkoxide and the organic compound can be evaporated together to form a mixed vapor or they can be evaporated separately and mixed in the vapor phase. In applications where the alkoxide and the organic compound (or another metal alkoxide) are immiscible, it may be desirable to mix these materials in the vapor phase after separate evaporation. Similarly, a plasma can be formed from: a mixed vapor of the metal alkoxide and organic materials, a plasma having a vapor of one material and the second material added, or a gas (carrier) to which the metal alkoxide and monomer materials are added. The alkoxide and organic compound can be condensed onto the substrate at a temperature below the condensation point of the vapor stream. Similarly, organic compounds can be mixed with the metal alkoxide prior to coating using liquid coating techniques.

Exemplary organic compounds include esters, vinyl compounds, alcohols, carboxylic acids, acid anhydrides, acyl halides, thiols, amines and mixtures thereof. Non-limiting examples of esters include (meth)acrylates, which can be used alone or in combination with other multifunctional or monofunctional (meth)acrylates.

The term "(meth)acrylic acid" includes either or both of acrylic acid and methacrylic acid, and the term "(meth) acrylate" includes either or both of an acrylate and a methacrylate.

Exemplary acrylates include hexanediol diacrylate, ethoxyethyl acrylate, phenoxyethyl acrylate, cyanoethyl (mono)acrylate, isobornyl acrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2,2,2-trifluoromethyl acrylate, diethylene glycol diacrylate, triethylene glycol diacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, trimethylol propane triacrylate, ethoxylated trimethylol propane triacrylate, propylated trimethylol propane triacrylate, tris(2-hydroxyethyl)-isocyanurate triacrylate, pentaerythritol triacrylate, pentaerythritol tetraacrylate, phenylthioethyl acrylate, naphthyloxyethyl acrylate, Ebecryl™ 130 cyclic diacrylate (from Cytec Industries Inc., New Jersey, U.S.A.), epoxy acrylate CN120E50 (from Sartomer Company, Exton, Pa., U.S.A.), the corresponding methacrylates of the acrylates listed above and mixtures thereof. Exemplary vinyl compounds include vinyl ethers, styrene, vinyl naphthylene and acrylonitrile. Exemplary alcohols include hexanediol, naphthalenediol, 2-hydroxyacetophenone, 2-hydroxy-2-methyl-1-phenyl-1-propanone, and hydroxyethylmethacrylate. Exemplary vinyl compounds include vinyl ethers, styrene, vinyl naphthylene and acrylonitrile. Exemplary carboxylic acids include phthalic acid and terephthalic acid, (meth)acrylic acid). Exemplary acid anhydrides include phthalic anhydride and glutaric anhydride. Exemplary acyl halides include hexanedioyl dichloride, and succinyl dichloride. Exemplary thiols include ethyleneglycol-bisthioglycolate, and phenylthioethylacrylate. Exemplary amines include ethylene diamine and hexane 1,6-diamine.

Metal layers can be made from a variety of materials. Exemplary metals include elemental silver, gold, copper, nickel, titanium, aluminum, chromium, platinum, palladium, hafnium, indium, iron, lanthanum, magnesium, molybdenum, neodymium, silicon, germanium, strontium, tantalum, tin, titanium, tungsten, vanadium, yttrium, zinc, zirconium or alloys thereof. In one embodiment, silver can be coated on a cured alkoxide layer. When two or more metal layers are employed, each metal layer can be the same or different from another layer, and need not have the same thickness. In one embodiment, the metal layer or layers are sufficiently thick so as to be continuous, and sufficiently thin so as to ensure that the metal layer(s) and articles employing these layer(s) will have a desired degree of visible light transmission. For example, the physical thickness (as opposed to the optical thickness) of the visible-light-transmissive metal layer or layers may be from about 5 to about 20 nm, from about 7 to about 15 nm, or from about 10 nm to about 12 nm. The thickness range also will depend on the choice of metal. The metal layer(s) can be formed by deposition on the above-mentioned substrate or on the inorganic or hybrid layer using techniques employed in the metallizing art such as sputtering (e.g., rotary or planar magnetron sputtering), evaporation (e.g., resistive or electron beam evaporation), chemical vapor deposition (CVD), metalorganic CVD (MOCVD), plasma-enhanced, assisted, or activated CVD (PECVD), ion sputtering, plating and the like.

Polymeric layers can be formed from a variety of organic materials. The polymeric layer may be crosslinked in situ after it is applied. In one embodiment, the polymeric layer can be formed by flash evaporation, vapor deposition and polymerization of a monomer using, for example, heat, plasma, UV radiation or an electron beam. Exemplary monomers for use in such a method include volatilizable (meth)acrylate monomers. In a specific embodiment, volatilizable acrylate monomers are employed. Suitable (meth) acrylates will have a molecular weight that is sufficiently low to allow flash evaporation and sufficiently high to permit condensation on the substrate. If desired, the additional polymeric layer can also be applied using conventional methods such as plasma deposition, solution coating, extrusion coating, roll coating (e.g., gravure roll coating), spin coating, or spray coating (e.g., electrostatic spray coating), and if desired crosslinking or polymerizing, e.g., as described above. The desired chemical composition and thickness of the additional layer will depend in part on the nature of the substrate and the desired purpose for the barrier film. Coating efficiency can be improved by cooling the substrate.

Barrier films prepared using the disclosed methods have a variety of uses including the fabrication of optically functional coatings. The disclosed methods provide the preparation of layers having a wide range of refractive indices from less than 1.45 to greater than 2.0. These layers can be fabricated in interference coating constructions to provide optical functions such as antireflective coatings for optical devices (e.g., such as displays, windows, instrument panels, and ophthalmic lenses), beam splitters, edge filters, subtraction filters, bandpass filters, Fabry-Perot tuned cavities, light-extracting-films, reflectors and other optical coating designs.

Thin metal layers, dyed or adsorbing layers or other additional layers can be applied to the substrate or the hybrid organic/inorganic layer or layers, to provide properties of optical functionality to the barrier coating or coatings. Additional layers such as fluorinated polyether coatings, such as fluorinated trialkoxysilane and fluorinated polyether oligomer functionalized with trimethoxy silane, can be used to provide low-surface energy to barrier films prepared using the methods of the invention. In addition, fluorinated layers such as fluorinated polyether coating, which typically have very low refractive index (for example, ≤1.4), can provide optical functionality such as antireflective properties to the barrier coating for applications like photovoltaic devices (solar cells), display devices, windows, and ophthalmic lenses. Films prepared using the disclosed methods can be used to provide dielectric properties in electrical and electronic devices.

Barrier films prepared using the disclosed methods, with color shifting properties can be used in security devices, for a variety of applications such as tamperproof images in value documents (e.g., currency, credit cards, stock certificates, etc., driver's licenses, government documents, passports, ID badges, event passes, or affinity cards), for product identification formats and advertising promotions for verification or authenticity, (e.g., CD's, DVD's, Blu-ray discs (BD), tape cassettes, playing cards, or beverage containers), brand enhancement images which can provide a floating or sinking or a floating and sinking image of the brand, information presentation images in graphics applications (e.g., kiosks, night signs and automotive dashboard displays), and novelty enhancement through the use of composite images on products (e.g., business cards, hang-tags, art, shoes and bottled products).

The smoothness and continuity of the disclosed film and the adhesion of subsequently applied layers to the coated substrate can be enhanced by appropriate pretreatment of the substrate or application of a priming or seed layer prior to forming the inorganic or hybrid layer. Modification of the surface to create hydroxyl or amine functional groups is particularly desirable. Methods for surface modification are known in the art. In one embodiment, a pretreatment regimen involves electrical discharge pretreatment of the substrate in the presence of a reactive or non-reactive atmosphere (e.g., plasma, glow discharge, corona discharge, dielectric barrier discharge or atmospheric pressure discharge), chemical pretreatment, or flame pretreatment. These pretreatments can help ensure that the surface of the substrate will be receptive to the subsequently applied layer(s). In one embodiment, the method can include plasma pretreatment. For organic surfaces, plasma pretreatments can include nitrogen or water vapor. Another pretreatment regimen involves coating the substrate with an inorganic or organic base coat layer optionally followed by further pretreatment using plasma or one of the other pretreatments described above. In another embodiment, organic base coat layers, and especially base coat layers based on crosslinked acrylate polymers are employed. The base coat layer can be formed by flash evaporation and vapor deposition of a radiation-crosslinkable monomer (e.g., an acrylate monomer), followed by crosslinking in situ (using, for example, an electron beam apparatus, UV light source, electrical discharge apparatus or other suitable device), as described in U.S. Pat. Nos. 4,696,719, 4,722,515, 4,842,893, 4,954,371, 5,018,048, 5,032,461, 5,097,800, 5,125,138, 5,440,446, 5,547,508, 6,045,864, 6,231,939 and 6,214,422; in published PCT Application No. WO 00/26973; in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996). If desired, the base coat can also be applied using conventional coating methods such as roll coating (e.g., gravure roll coating) or spray coating (e.g., electrostatic spray coating), then crosslinked using, for example, heat, UV radiation or an electron beam. The desired chemical composition and thickness of the base coat layer will depend in part on the nature of the substrate. For example, for a PET substrate, the base coat layer can be formed from an acrylate monomer and may for example have a thickness of only a few nm up to about 20 micrometers.

The films can be subjected to post-treatments such as heat treatment, UV or vacuum UV (VUV) treatment, or plasma treatment. Heat treatment can be conducted by passing the film through an oven or directly heating the film in the coating apparatus, e.g., using infrared heaters or heating directly on a drum. Heat treatment may for example be performed at temperatures from about 30° C. to about 200° C., about 35° C. to about 150° C., or about 40° C. to about 70° C.

An example of an apparatus 100 that can conveniently be used to perform the disclosed method is shown in FIG. 1. Powered reels 102a and 102b move substrate 104 back and forth through apparatus 100. Temperature-controlled rotating drum 106 and idlers 108a and 108b carry substrate 104 past plasma source 110, metal sputtering applicator 112, monomer or liquid metal alkoxide evaporator 114, and UV lamps 116. Liquid alkoxide 118 is supplied to evaporator 114 from reservoir 120. Optionally, liquid 118 can be discharged into the evaporator through an atomizer (not shown). Optionally, gas flows (e.g., nitrogen, argon, helium) can be introduced into the atomizer or into the evaporator (not shown in FIG. 1). Optionally, a plasma of the metal alkoxide vapor can be formed in evaporator 114 (not shown in FIG. 1). Vapor from the evaporator 114 passes through a nozzle or diffuser (not shown in FIG. 1) and condenses on substrate 104. Water can be supplied through the gas manifold (not shown in FIG. 1) in plasma source 110 prior to or after the metal alkoxide layer is condensed. Optionally, liquid metal alkoxide 118 can be applied to substrate 104 by a separate applicator (not shown) using liquid coating techniques. Liquid metal alkoxide applicator can be supplied from reservoir 120 or a separate reservoir (not shown). Infrared lamp 124 can be used to heat the substrate prior to or after application of one or more layers. Successive layers can be applied to the substrate 104 using multiple passes (in either direction) through apparatus 100. Optional liquid monomer can be applied through evaporator 114 or a separate evaporator (not shown) supplied from reservoir 120 or a separate reservoir (not shown). UV lamps 116 can be used to produce a crosslinked polymer layer from the monomer. Apparatus 100 can be enclosed in a suitable chamber (not shown in FIG. 1) and maintained under vacuum or supplied with a suitable inert atmosphere in order to discourage oxygen, dust and other atmospheric contaminants from interfering with the various pretreatment, alkoxide coating, crosslinking and sputtering steps.

Figure 2:
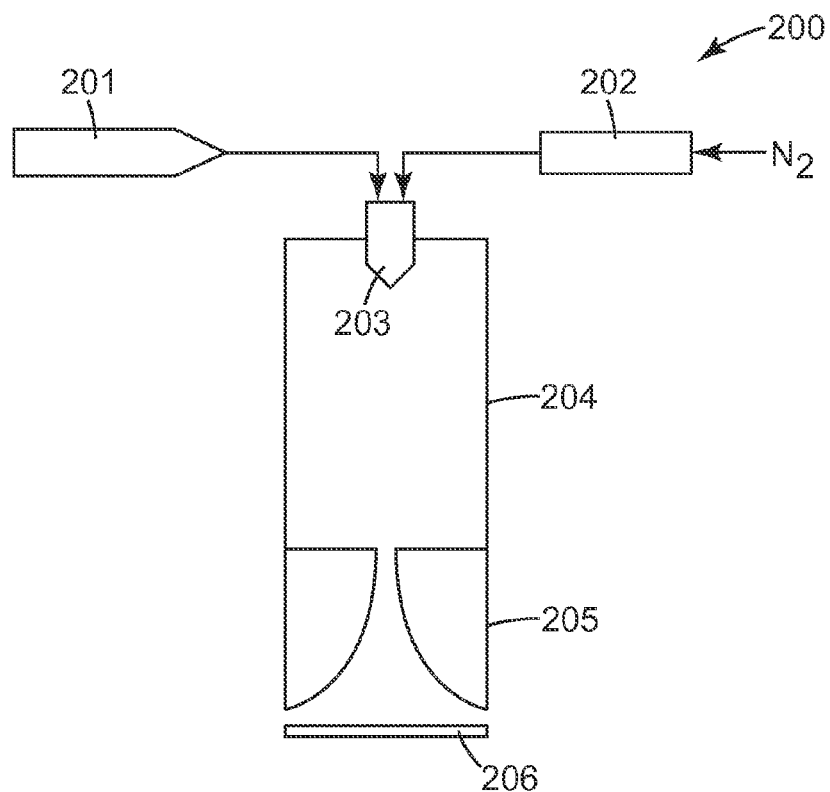
FIG. 2 is a schematic representation of a static, step-and-repeat, in-line or conveyor coater suitable for use in the disclosed method.

Another example of an apparatus 200 that can conveniently be used to perform the disclosed method is shown in FIG. 2. Liquid metal alkoxide in syringe pump 201 is mixed with nitrogen from heater 202 in atomizer 203, which atomizes the metal alkoxide. The resulting droplets can be delivered to vaporizer 204 where the droplets are vaporized. The vapor passes through diffuser 205 and condenses on substrate 206. The substrate 206 with condensed metal alkoxide is treated in-place or removed and treated with water, to cure the alkoxide in a subsequent step. Optionally, a plasma of the metal alkoxide vapor can be formed in vaporizer 204 (not shown in FIG. 2) before the vapor passes through diffuser 205 and condenses on substrate 206. A catalytic burner (not shown) can be used to supply heat and water vapor. Apparatus 200 can be used to apply optional liquid monomer through syringe pump 201 or a separate syringe pump (not shown). The condensed monomer on substrate 206 is crosslinked in a subsequent step.

Other functional layers or coatings that can be added to the inorganic or hybrid film include an optional layer or layers to make the film coated substrate more rigid. The uppermost layer of the article is optionally a suitable protective layer. If desired, the protective layer can be applied using conventional liquid coating methods such as roll coating (e.g., gravure roll coating), spin coating, or spray coating (e.g., electrostatic spray coating), then crosslinked using, for example, UV radiation. The protective layer can also be formed by flash evaporation, vapor deposition and crosslinking of a monomer as described above. Volatilizable (meth)acrylate monomers are suitable for use in such a protective layer. In a specific embodiment, volatilizable acrylate monomers are employed.

For some applications, it may be desirable to alter the appearance or performance of the film, such as by laminating a dye containing layer to the inorganic or hybrid film, applying a pigmented coating to the surface of the inorganic or hybrid film, or including a dye or pigment in one or more of the materials used to make the inorganic or hybrid film. The dye or pigment can absorb in one or more selected regions of the spectrum, including portions of the infrared, ultraviolet or visible spectrum. The dye or pigment can be used to complement the properties of the inorganic or hybrid film. A particularly useful pigmented layer that can be employed in the films is described in published PCT Application No. WO 2001/58989. This layer can be laminated, extrusion coated or coextruded as a skin layer on the disclosed film. The pigment loading level can be varied, e.g., between about 0.01 and about 2% by weight, to vary the visible light transmission as desired. The addition of a UV absorptive cover layer can also be desirable in order to protect any inner layers of the article that may be unstable when exposed to UV radiation. Other functional layers or coatings that can be added to the inorganic or hybrid film include an optional layer or layers to make the article more rigid.

The uppermost layer of the article is optionally a suitable protective layer. If desired, the protective layer can be applied using conventional coating methods such as roll coating (e.g., gravure roll coating), spin coating, or spray coating (e.g., electrostatic spray coating), then crosslinked using, for example, UV radiation. The protective layer can also be formed by flash evaporation, vapor deposition and crosslinking of a monomer as described above. Volatilizable (meth)acrylate monomers are suitable for use in such a protective layer. In a specific embodiment, volatilizable acrylate monomers are employed.

In another embodiment, multiple films made by the invention can be joined together to form a laminate structure. The laminate structure can have improved barrier performance relative to individual films of the invention. The lamination process can be performed using heat or pressure. Optionally, adhesive materials can be used to join the multiple films of the invention. The adhesive material can be any of those known in the art that are suitable for the materials to be joined and the final properties desired of the laminate structure, for example, pressure-sensitive adhesives, reactive adhesives, hot-melt adhesives, and heat seal materials. Particularly useful are optically clear adhesives such as the 8100 series of optically clear laminating adhesive from 3M and 3M #9483 optically clear laminating adhesive.

The invention is further illustrated in the following examples, in which all parts, percentages and ratios are by weight unless otherwise indicated. Unless otherwise noted, all solvents and reagents are available from commercial suppliers such as E.I. du Pont de Nemours Company or Aldrich Chemical Company.

Example 1

Tetra(ethoxy) Titanate

A thin film was formed from tetra(ethoxy) titanate (DuPont Tyzor ET) using a vapor coater similar to the coater illustrated schematically in FIG. 1. The substrate was a 4-mil thick, 18-inch wide polyester (DuPont 454). In the first pass through the coater, the substrate was plasma treated with water vapor plasma at 0.3 Torr, operating at 400 kHz, a net power of 400 W and a line speed of 40 fpm.

Tetra(ethoxy) titanate was dispensed into a glass jar and placed into a vacuum bell jar for degassing. The bell jar was evacuated to 0.012 Torr for a period of 20 minutes. After degassing, the bell jar was vented to atmosphere and the liquid loaded into a syringe. The syringe was mounted on a syringe pump and connected to an atomizer/evaporator system as described in PCT International Publication No. WO 2008/030262. For the second pass through the coater, the tetra(ethoxy) titanate was pumped to the atomizer at a flow rate of 1.0 ml/min. The flow rate of nitrogen gas to the atomizer was 15 sccm. The tetra(ethoxy) titanate was atomized into fine droplets and flash evaporated when the droplets contacted the hot evaporator wall surface (150° C.). The vapor flow exited a 16-inch-wide coating die and condensed on the substrate moving at a line speed of 16 fpm. The process drum temperature was 158° F. The condensed layer of tetra(ethoxy) titanate was immediately exposed to water vapor in the vacuum chamber to cure the coating. A continuous flow of distilled water vapor was introduced into the chamber from a temperature controlled flask of liquid water held at 80° F. The chamber throttle valve kept the chamber pressure (mostly water vapor) at 0.95 Torr.

Figure 3:
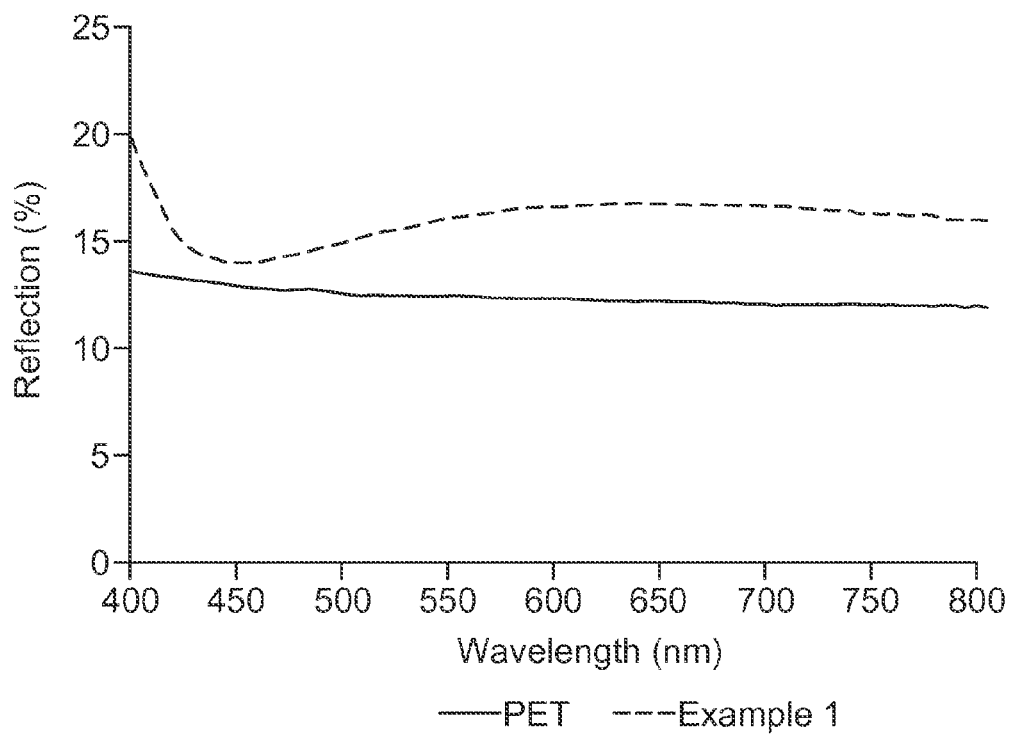
FIG. 3 is a reflectance spectrum of the sample prepared in Example 1.

The reflectance spectrum of Sample 1 is shown in FIG. 3. The cured organotitanate film has higher reflectance than the uncoated PET substrate, indicating a higher refractive index than that of the PET (n=1.65). From the reflectance data, the thickness and refractive index of the film were calculated to be about 82 nm and 1.82, respectively at a wavelength of 600 nm.

Example 2

Tetra(ethoxy) Titanate

A polyester substrate (DuPont 454) was coated using the procedure of Example 1, with the following changes: The coating material, tetra(ethoxy) titanate, was handled in a nitrogen-purged glove box with vacuum capability to degas the liquid and was not exposed to atmospheric moisture during the degas and syringe loading process. The water vapor was continuously flowing into the coater chamber via a mass flow controller (MKS VODM) at a flow rate of 1000 sccm. The process drum temperature was 60° F. The evaporator temperature was 200° C. Nitrogen gas was introduced as a carrier gas in the evaporator at a flow rate of 67 sccm. The substrate speed was 18.7 fpm. The throttle valve kept the chamber pressure at 2.0 Torr. From the reflectance data, the thickness and refractive index of the film were calculated to be about 79 nm and 1.80, respectively, at a wavelength of 570 nm.

Example 3

Tetra(isopropoxy) Titanate

A polyester substrate (DuPont 454) was coated using the procedure of Example 1, with the following changes: The coating material was tetra(isopropoxy) titanate (DuPont Tyzor TPT). The process drum temperature was 63° F. The evaporator temperature was 100° C. The substrate speed was 15 fpm. The throttle valve kept the chamber pressure at 1.0 Torr. The first pass plasma pretreatment gas was nitrogen. From the reflectance data, the thickness and refractive index of the film were calculated to be about 59 nm and 1.89, respectively.

Examples 4-6

Tetra(n-propoxy) Titanate and Tetra(n-butoxy) Zirconate

A polyester substrate (DuPont 453, 2-mil) was coated using the procedure of Example 1, with the following changes: Two monomer syringes and syringe pumps were used, one containing tetra(n-propoxy) titanate (DuPont Tyzor NPT) and the other containing tetra(n-butoxy) zirconate (DuPont Tyzor NBZ). The syringes containing the alkoxides were connected in parallel to enable either syringe separately or both together (mixed as liquids) to pump material to the atomizer. The evaporator temperature was 275° C. The remaining process conditions, coating thickness and refractive index for Examples 4-6 are described in Table 1, below.

TABLE 1

Process Conditions and Coating Characterization

| Example No. | DuPont Tyzor NPT Flow Rate (ml/min) | DuPont Tyzor NBZ Flow Rate (ml/min) | Film Speed (fpm) | Coating Index of Refraction | Coating Thickness (nm) |
|---|---|---|---|---|---|
| 4 | 1.0 | 0 | 16 | 1.81 | 62 |
| 5 | 0.4 | 0.68 | 10 | 1.72 | 183 |
| 6 | 0 | 1.133 | 10 | 1.69 | 165 |

Example 7

Tetra(n-propoxy) Zirconate

A polyester substrate (DuPont 454, 4-mil) was coated using the procedure of Example 2, with the following changes: The coating material was tetra(n-propoxy) zirconate (Tyzor NPZ). The evaporator temperature was 275° C. The substrate line speed was 9.5 fpm. The liquid Tyzor NPZ flow rate was 1.05 ml/min. The throttle valve kept the chamber pressure at 3 Torr. The nitrogen flow into the atomizer was 10 sccm. From the reflectance data, the thickness and refractive index of the film were calculated to be about 82 nm and 1.72, respectively, at a wavelength of 565 nm.

Examples 8-10

Tetra(n-propoxy) Zirconate and Tetra(ethoxy) Titanate

A polyester substrate (DuPont 454, 4-mil) was coated using the procedure of Example 2, with the following changes: Two monomer syringes and syringe pumps were used, one containing tetra(n-propoxy) zirconate (DuPont Tyzor NPZ) and the other containing tetra(ethoxy) titanate (DuPont Tyzor ET). The syringes containing the alkoxides were connected in parallel to enable either syringe separately or both together to pump material to the atomizer. The evaporator temperature was 275° C. The coating die was 12-inches wide. The substrate line speed was 12 fpm. The nitrogen flow into the atomizer was 10 sccm. The remaining process conditions, coating thickness and refractive index for Examples 8-10 are described in Table 2, below.

TABLE 2

Process Conditions and Coating Characterization

| Example No. | DuPont Tyzor NPZ Flow Rate (ml/min) | DuPont Tyzor ET Flow Rate (ml/min) | Wavelength % Rmax (nm) | Coating Index of Refraction | Coating Thickness (nm) |
|---|---|---|---|---|---|
| 8 | 0.670 | 0.188 | 530 | 1.70 | 78 |
| 9 | 0.446 | 0.375 | 610 | 1.69 | 90 |
| 10 | 0.223 | 0.563 | 550 | 1.74 | 79 |

Example 11

Polydimethoxysiloxane and Tetra(ethoxy) Titanate

A polyester substrate (DuPont 454, 4-mil) was coated using the procedure of Example 2, with the following changes: Two monomer syringes and syringe pumps were used, one containing Polydimethoxysiloxane (Gelest PS-012) and the other containing tetra(ethoxy) titanate (DuPont Tyzor ET). The polydimethoxysiloxane syringe was connected to the atomizer via a capillary tube. The tetra (ethoxy) titanate was delivered from the syringe directly to the interior wall of the hot evaporator via a capillary. In this way, the two reactive liquids were delivered separately into the evaporator, evaporated, and mixed as low pressure vapors prior to exiting the coating die, co-condensing and curing on the substrate. The evaporator temperature was 275° C. The coating die was 12-inches wide. The liquid polydimethoxysiloxane flow rate to the atomizer was 0.938 ml/min and the tetra(ethoxy) titanate flow rate to the evaporator wall was 0.1 ml/min. The substrate line speed was 12 fpm. The nitrogen flow into the atomizer was 10 sccm. From the reflectance data, the thickness and refractive index of the film were calculated to be about 175 nm and 1.50, respectively, at a wavelength of 1050 nm.

Example 12

Methyltriacetoxy Silane

A polyester substrate (DuPont 454) was coated using the procedure of Example 2, with the following changes: The coating material was methyltriacetoxy silane (a solid at room temperature). The material was melted at 50° C. and loaded into a heated syringe (50° C.) after degassing. The water vapor pressure in the chamber was 3.0 Torr. The water vapor flow rate was 2000 sccm. The nitrogen carrier gas flow rate into the evaporator was 200 sccm. The substrate speed was 10.9 fpm.

Figure 4:
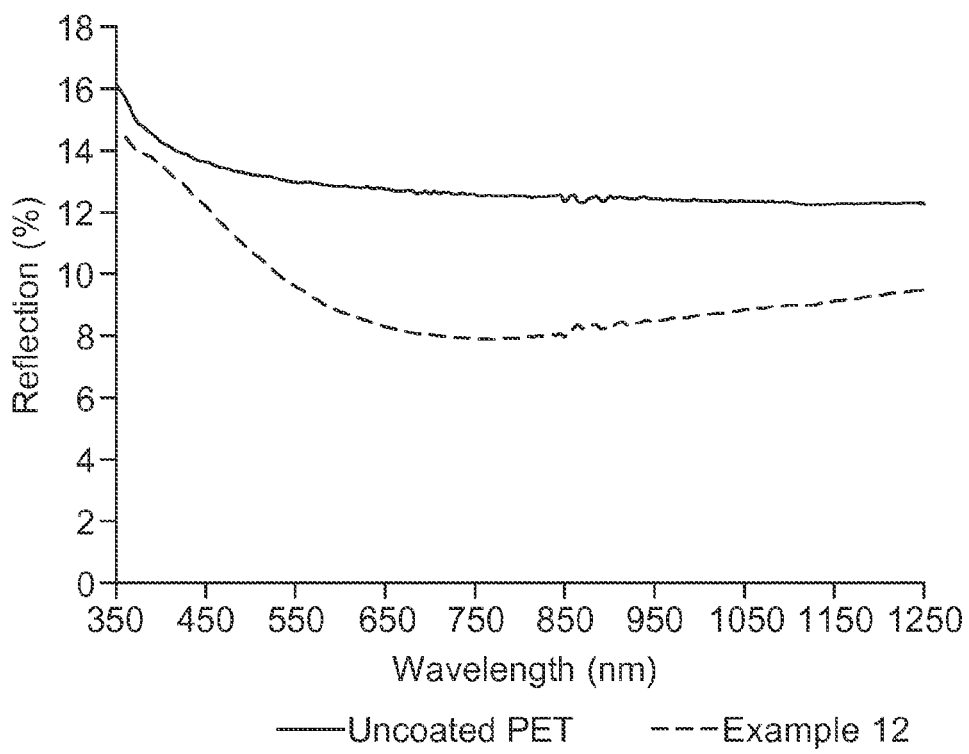
FIG. 4 is a reflectance spectrum of the sample prepared in Example 12.

The reflectance spectrum of PET and the film formed in Example 12 are shown in FIG. 4. The cured methyltriacetoxy silane film has lower reflectance than the uncoated PET substrate, indicating a lower refractive index than that of the PET (n=1.65). The thickness and refractive index of the coating, calculated from the reflectance data, were about 131 nm and 1.45, respectively, at a wavelength of 760 nm.

Example 13

Tetra(ethoxy) Titanate and Ethyleneglycol-bisthioglycolate

A polyester substrate (DuPont 453, 4-mil) was coated using the procedure of Example 2, with the following changes: Two monomer syringes and syringe pumps were used, one containing tetra(ethoxy) titanate (DuPont Tyzor ET) and the other containing ethyleneglycol-bisthioglycolate (Sigma-Aldrich). The syringes containing the alkoxides were connected in parallel to enable either syringe separately or both together to pump material to the atomizer. The evaporator temperature was 275° C. The coating die was 12-inches wide. The liquid tetra(ethoxy) titanate flow rate was 0.9 ml/min and the liquid ethyleneglycol-bisthioglycolate flow rate was 0.1 ml/min. The substrate line speed was 16 fpm. The water vapor flow rate into the chamber was 2000 sccm. The nitrogen flow into the atomizer was 10 sccm. The nitrogen carrier gas flow into the evaporator was 200 sccm. The thickness and refractive index of the coating, calculated from the reflectance data, were about 87 nm and 1.82, respectively, at a wavelength of 635 nm.

Examples 14 and 15

Tetra(ethoxy) Titanate and Tripropyleneglycol Diacrylate

A polyester substrate (DuPont 454, 4-mil) was coated, as in Example 2, with the following changes: Two monomer syringes and syringe pumps were used, one containing tetra(ethoxy) titanate (DuPont Tyzor ET) and the other containing a mixture of 97% tripropyleneglycol diacrylate (Sartomer SR-306) and 3% photoinitiator Darocur™ 1173 (Ciba). In example 14, the liquid streams from both syringes were joined together just before entering the atomizer, enabling the metal alkoxide and acrylate materials to mix inline as liquids prior to atomization and evaporation. In example 15, the liquid streams from the two syringes were kept separate. Each liquid stream was directed to a separate atomizer mounted in separate evaporators. The evaporated metal alkoxide and acrylate materials were mixed as vapors and exited one coating die prior to condensation onto the substrate. The coating die was 12-inches wide. The nitrogen flow into each atomizer was 10 sccm.

The remaining process conditions, coating thickness and refractive index for Examples 14 and 15 are described in Table 3. Note that the coating of sample 14 was thick enough to have two reflection maxima in the spectral range 350-1250 nm. Thus, two separate calculations to estimate refractive index and thickness were performed on these data and both calculations are recorded in Table 3.

TABLE 3

Process Conditions and Coating Characterization.

| Example No. | Mixing State | Tyzor ET Flow rate (ml/min) | SR-306 + Darocure 1173 Flow rate (ml/min) | Line speed (fpm) | Wavelength % Rmax (nm) | Coating Index of Refraction | Coating Thickness (nm) |
|---|---|---|---|---|---|---|---|
| 14 | Liquid | 0.637 | 0.113 | 8 | 450 | 1.87 | 181 |
| 14 | | | | | 1120 | 1.75 | 160 |
| 15 | Vapor | 0.9 | 0.1 | 16 | 745 | 1.73 | 108 |

Example 16

Tetra(ethoxy) Titanate and Phenylthioethylacrylate with Pentaerythritol Triacrylate A polyester substrate (DuPont 454, 4-mil) was coated using the procedure of Example 2, with the following changes: Two monomer syringes and syringe pumps were used, one containing tetra(ethoxy) titanate (DuPont Tyzor ET) and the other containing a mixture of 82.5% phenylthioethylacrylate (Bimax PTEA), 14.5% pentaerythritol triacrylate (San Ester Viscoat 300 PETA) and 3% photoinitiator Darocur 1173 (Ciba). The syringes were connected in parallel to enable either syringe separately or both together to pump material to the atomizer. The evaporator temperature was 275° C. The coating die was 12-inches wide. The liquid Tyzor ET flow rate was 0.675 ml/min and the liquid acrylate mixture flow rate was 0.075 ml/min. The substrate line speed was 8 fpm. The nitrogen flow into the atomizer was 10 sccm. The thickness and refractive index of the coating, calculated from the reflectance data, were about 161 nm and 1.96, respectively, at a wavelength of 420 nm.

Example 17

Tetra(ethoxy) Titanate and Darocur 1173

A polyester substrate (DuPont 454, 4-mil) was coated using the procedure of Example 2, with the following changes: The substrate was attached to the process drum. Tyzor ET (8.5 g) was mixed with 1.5 g of 2-hydroxy-2-methyl-1-phenyl-1-propanone (Darocur 1173 from Ciba) in the nitrogen-purged glove box, prior to vacuum degassing and loading into the syringe. The substrate (PET) was plasma-treated with a water-vapor plasma at a pressure of 300 mtorr, water vapor flowrate of 500 sccm, net plasma power of 600 W at a frequency of 400 kHz, with the process drum rotating for 1 drum revolution with the sample passing the plasma source at 40 fpm. After the plasma treatment, the evaporator was heated to 200° C. and the process drum temperature was set to 61° F. The chamber was filled with water vapor and nitrogen to a pressure of 2.0 Torr with a water vapor flow of 1000 sccm and a nitrogen flow of 77 sccm (into the atomizer and evaporator). The coating die was 12-inches wide. The liquid (Tyzor ET and Darocur 1173) flow rate was 1.0 ml/min. The sample was rotated past the vapor coating die at a speed of 15 fpm for 1 revolution to condense the liquid layer of Tyzor ET and Darocur 1173. Then the process drum was heated to 150° F. and the chamber pressure increased to 8 Torr (with a flow of 3000 sccm water vapor and 210 sccm nitrogen). The sample was exposed to this continuous flow of water vapor for 30 minutes. The thickness and refractive index of the coating, calculated from the reflectance data, were about 79 nm and 1.90, respectively, at a wavelength of 600 nm.

Example 18

Tetra(ethoxy) Titanate on Metallized PET

A polyester substrate (DuPont 454) was coated using the procedure of Example 1, with the following changes: The substrate surface was sputter-coated with a thin layer of chromium (~5 nm) prior to (in a previous coater pass) the application of the tetra(ethoxy) titanate. No surface plasma treatment was applied before the titanate coating. The process drum temperature was 25° F. The pressure of the water vapor in the chamber was controlled to 1.5 Torr by the throttle valve. The substrate line speed was varied between 13 and 30 fpm.

Examples 19-21

Tetra(ethoxy) Titanate on Coated PET

Figure 5:
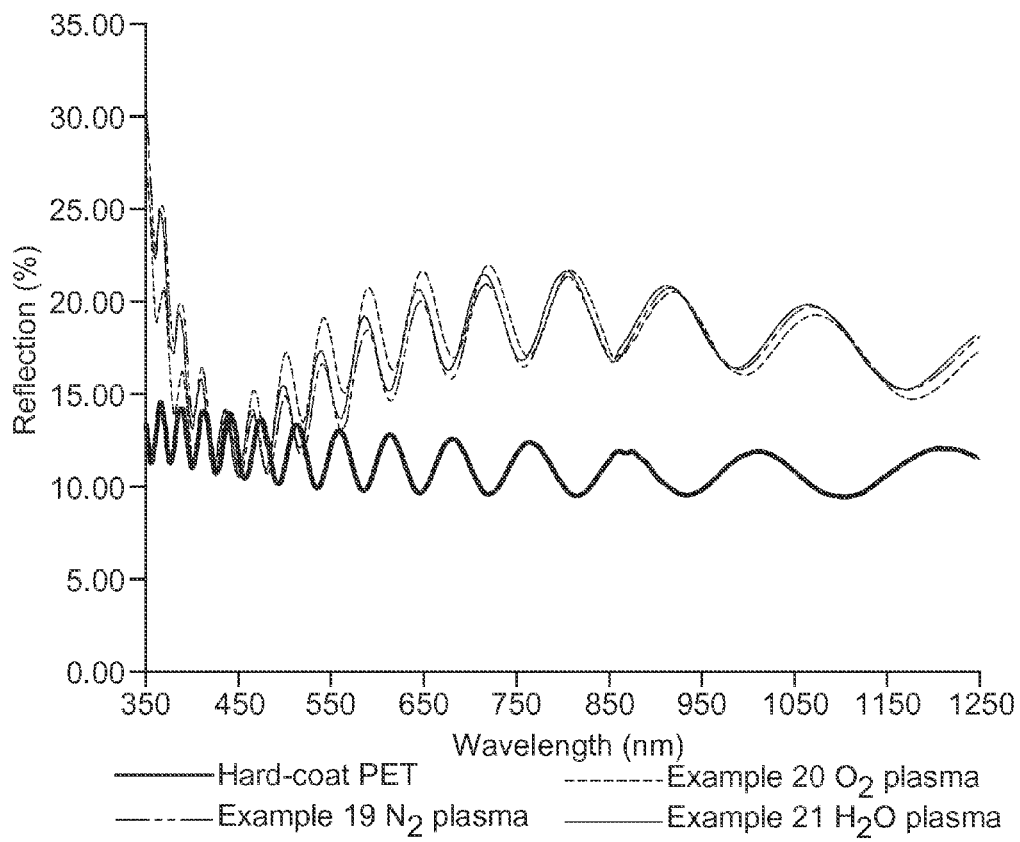
FIG. 5 are reflectance spectra of the samples prepared in Examples 18-20.

A polyester substrate (DuPont 454) was coated, as described in Example 2, with the following changes: The substrate was a 5-mil thick clear PET substrate with a surface coating (hard-coat formulation containing acrylate materials and $SiO_2$ particles). The gas/vapor used in the first-pass plasma pretreatment was varied: in Example 19 the gas was nitrogen, in Example 20 the gas was oxygen, and in Example 21 the gas was water vapor. The substrate speed for the tetra(ethoxy) titanate deposition was 14 fpm. The liquid Tyzor ET flow rate was 0.75 ml/min. The nitrogen flow into the atomizer was 7.5 sccm. The coating die was 12-inches wide. The reflectance spectra of the samples from Examples 19-21 and the PET support are shown in FIG. 5.

Example 22

Tetra(ethoxy) Titanate with UV Pretreatment

A polyester substrate (DuPont 453 2-mil) was coated using the procedure of Example 1, with the following changes: The first pass plasma pretreatment gas was nitrogen. In the second pass, the throttle valve kept the chamber pressure ($H_2O$ vapor) at 0.3 Torr. In the second pass through the coater the plasma-treated substrate was exposed to UV light for about 4 seconds (in the presence of 0.3 Torr water vapor) immediately before the tetra(ethoxy) titanate deposition. Two low-pressure-mercury-arc lamps were used, generating UV light with primary emission lines at 185 nm and 254 nm wavelengths. Also in the second pass, the coated substrate was exposed to 0.3 Torr water vapor plasma (650 W, 400 kHz) for about 12 seconds immediately after deposition of the titanate. The thickness and refractive index of the coating, calculated from the reflectance data, were about 85 nm and 1.78, respectively.

Examples 23-26

Tetra(ethoxy) Titanate on $CrO_x$-Coated PET

A polyester substrate (DuPont 453-2 mil) was coated as follows: Coater pass 1 was deposition of an acrylate layer, using the following sequence and deposition-curing equipment and parameters:

The acrylate material was a mixture of Ebecryl 130 (Cytec—73.5%) and Lauryl Acrylate (Sartomer Chemicals—24.5%) with Photoinitiator (Darocur 1173—Ciba Specialty Chemicals—2%).

The flow of acrylate mixture was 1.0 ml/minute.
The evaporator temperature was 275° C.
The drum temperature was 25° F.
The substrate speed was 34 fpm.
The acrylate layer was cured by exposure to UV lamps (2 low-pressure-mercury-arc lamps emitting 185 and 254 nm wavelengths as described in Example 22 and 3 low-pressure-mercury-arc lamps emitting the 254 nm wavelength only).

Same pass plasma pretreatment of surface was with $N_2$ plasma at 0.3 Torr, power set to 340 W, and 400 kHz.

Coater pass 2 was UV lamps post-cure at 10 fpm of selected substrate regions.

Coater pass 3 was sputter deposition of chromium in an oxidizing atmosphere to provide a $CrO_x$ (~1-2 nm) layer in selected substrate regions (see Table 4, below).

Coater pass 4 was a substrate rewind pass.

Coater pass 5 was an $H_2O$ plasma treatment pass of selected substrate regions at 0.3 Torr, 40 fpm and 400 W at 400 kHz (see Table 4, below).

Coater pass 6 was tetra(ethoxy) titanate deposition using the procedure of Example 1, except at 9 fpm, and with the inclusion of IR lamp post-heating of the surface immediately following the deposition zone.

Table 4 summarizes the processing conditions for examples 23-26:

TABLE 4

Process Conditions

| Example No. | Sample Reference | $CrO_x$ (~1-2 nm) layer between acrylate and tetra(ethoxy) titanate layers | $H_2O$ Plasma pre-treatment before tetra(ethoxy) titanate layer |
|---|---|---|---|
| 23 | L | No | Yes |
| 24 | M | Yes | Yes |
| 25 | N | No | No |
| 26 | O | yes | No |

Example 27

Tetra(ethoxy) Titanate with Acetic Acid/Water Cure

A polyester substrate (DuPont 454 4 mil) was coated using the procedure of Example 1, with the following changes: Two monomer syringes and syringe pumps were used, each containing tetra(ethoxy) titanate (DuPont Tyzor ET). The syringes containing the alkoxide were in parallel and each operated at 0.5 ml/min, generating a total liquid flow rate of 1.0 ml/min to the atomizer. The temperature-controlled flask contained 3% acetic acid in water. The pressure of the water and acetic acid vapor in the chamber was controlled to 2 Torr by the throttle valve. The thickness and refractive index of the coating, calculated from the reflectance data, were about 49 nm and 1.92, respectively.

Example 28

Tetra(ethoxy) Titanate 0.2 Torr Water

A polyester substrate (DuPont 454 4-mil) was coated using the procedure of Example 1, with the following change: The pressure of the water vapor in the chamber was controlled to 0.2 Torr by the throttle valve. The thickness and refractive index of the coating, calculated from the reflectance data, were about 87 nm and 1.79, respectively.

Examples 29-32

Tetra(ethoxy) Titanate with Varying Water Pressure

A polyester substrate (DuPont 454 4-mil) was coated, as in Example 2, with the following changes: The evaporator temperature was 150° C. The coating die was 12-inches wide. The water vapor flow rate was 3000 sccm. The flow rate of the nitrogen carrier gas entering the evaporator was 200 sccm. The line speed was 21 fpm. The pressure of the water vapor in the chamber was varied as recorded in Table 5, below:

TABLE 5

Process Conditions and Coating Characterization for Examples 28-31.

| Example No. | $H2O$ Pressure (Torr) | Wavelength % Rmax (nm) | Coating Index of Refraction | Coating Thickness (nm) |
|---|---|---|---|---|
| 29 | 8 | 380 | 1.97 | 48 |
| 30 | 5 | 525 | 1.85 | 71 |
| 31 | 2 | 760 | 1.74 | 109 |
| 32 | 1 | 650 | 1.76 | 92 |

Example 33

Tetra(isopropoxy) Titanate

A polyester substrate (DuPont 454) was coated using the procedure of Example 3, with the following change: During the second pass (tetra(isopropoxy) titanate deposition) the coated substrate was heated to ~140° F. in the presence of 1.0 Torr $H_2O$ vapor by 5 second exposure to two IR lamps just prior to substrate windup. The thickness and refractive index of the coating, calculated from the reflectance data, were about 67 nm and 1.85, respectively.

Example 34

Tetra(isopropoxy) Titanate with $H_2O$ Plasma

A polyester substrate (DuPont 454) was coated, as in Example 3, with the following change: The coated substrate was exposed to 1.0 Torr water vapor plasma (500 W, 400 kHz) for about 12 seconds immediately after deposition of the titanate. The thickness and refractive index of the coating, calculated from the reflectance data, were about 69 nm and 1.78, respectively.

Example 35

Tetra(isopropoxy) Titanate with Heat Treatment

The coated substrate prepared using the procedure of Example 33 was placed in an oven at 70° C. for 60 minutes. After heating, the optical reflectance spectrum was obtained. The thickness and refractive index of the coating, calculated from the reflectance data, were about 61 nm and 1.95, respectively.

Examples 36 and 37

Tetra(ethoxy) Titanate with Heat Treatment

A polyester substrate (DuPont 454) was coated using the procedure of Example 1, with the following changes: The process drum temperature was about 30° F. After coating, the substrate was post-treated in the process chamber in a 0.3 Torr nitrogen environment, at a substrate speed of 10 fpm. The post-treatment involved heating the film coated substrate on the process drum at 158° F. the second sample (Example 37) was exposed for 18 seconds to the UV lamps described in Examples 23-26. The post-process conditions, coating thickness and refractive index for Examples 36-37 are described in Table 6, below.

TABLE 6

Process Conditions and Coating Characterization.

| Example no. | Post-treatment Drum Temp (° F.) | Post-treatment Exposure to UV | Coating Index of Refraction | Coating Thickness (nm) |
|---|---|---|---|---|
| 36 | 158 | No | 1.81 | 77 |
| 37 | 158 | Yes | 1.82 | 77 |

Example 38

Tetra(isopropoxy) Titanate with IR Heat Treatment

A polyester substrate (DuPont 454) was coated using the procedure of Example 33, with the following changes: The web speed during the second pass (titanate layer deposition) was 15 fpm. In a third pass through the chamber, the titanate coating was heated to a temperature above 150° F. in the presence of 0.3 Torr water vapor by 12 seconds exposure to two IR lamps. The thickness and refractive index of the coating, calculated from the reflectance data, were about 71 nm and 1.86, respectively.

Example 39

Tetra(isopropoxy) Titanate with $H_2O$ Plasma Treatment

A polyester substrate (DuPont 454) was coated using the procedure of Example 3, with the following changes: In a third pass through the coater, the tetra(isopropoxy) titanate coating was exposed to 0.3 Torr water vapor plasma post-treatment (500 W, 400 kHz) for 12 seconds (15 fpm), with the drum temperature during the plasma post-treatment controlled at 63° F. There was no heating by IR lamps during the third pass. The thickness and refractive index of the coating, calculated from the reflectance data, were about 70 nm and 1.85, respectively.

Example 40 and 41

Tetra(ethoxy) Titanate with Plasma Treatment

A polyester substrate (DuPont 454) was coated using the procedure of Example 1, with the following changes: In a third pass through the chamber, the tetra(ethoxy) titanate coating was exposed to a plasma post-treatment (500 W, 400 kHz, 0.3 Torr) for 4 minutes (substrate stopped), with the drum temperature during the plasma post-treatment controlled to 60° F. The plasma gas was either oxygen or argon, as indicated for Examples 40 and 41 in Table 7, below.

TABLE 7

Process Conditions and Coating Characterization.

| Example No. | Plasma Gas | Coating Index of Refraction | Coating Thickness (nm) |
|---|---|---|---|
| 40 | $O_2$ | 1.82 | 91 |
| 41 | Ar | 1.86 | 70 |

Examples 42-45

Two-Layer Antireflection Article Construction Tetra(ethoxy) Titanate and Acrylate A polyester substrate (DuPont 454) was coated, in the following sequence, to form two-layer antireflection article constructions:

The first coater pass was an $H_2O$ plasma treatment at 0.3 Torr chamber pressure, 400 watts net power, 400 kHz, and at 40 fpm.

The second coater pass was deposition of tetra(ethoxy) titanate using the procedure of Example 1, except that substrate speed was varied, in discrete intervals, over the course of the coater pass (see Table 8, below).

The third coater pass was for the deposition of an acrylate layer, using the following sequence and deposition-curing equipment and parameters:

The acrylate material was a mixture of Ebecryl 130 (Cytec—73.5%) and Lauryl Acrylate (Sartomer Chemicals—24.5%) with Photoinitiator (Darocur 1173—Ciba Specialty Chemicals—2%).

The liquid acrylate formulation flow rate was 1.0 ml/minute.

The evaporator temperature was 275° C.

The drum temperature was 25° F.

The substrate speed was varied, in discrete intervals, over the course of the coater pass (see Table 8, below).

The acrylate layer was cured by exposure to UV lamps as described in Examples 23-26.

Same pass plasma pretreatment of surface was with $N_2$ plasma at 0.3 Torr, 400 kHz, and power (W) varied as 10× that of substrate speed (fpm).

TABLE 8

Process Conditions.

| Example No. | Sample Ref. | R (reflectance) % min. | $R_{vis}$ (450-650 nm) % Avg. | Titanate fpm | Acrylate fpm |
|---|---|---|---|---|---|
| 42 | H | 0.53 | 1.3 | 16 | 83.6 |
| 43 | M | 0.73 | 1.3 | 15 | 86.5 |
| 44 | O | 0.39 | 1.3 | 17 | 86.5 |
| 45 | P | 0.28 | 1.1 | 17 | 83.6 |

Figure 6:
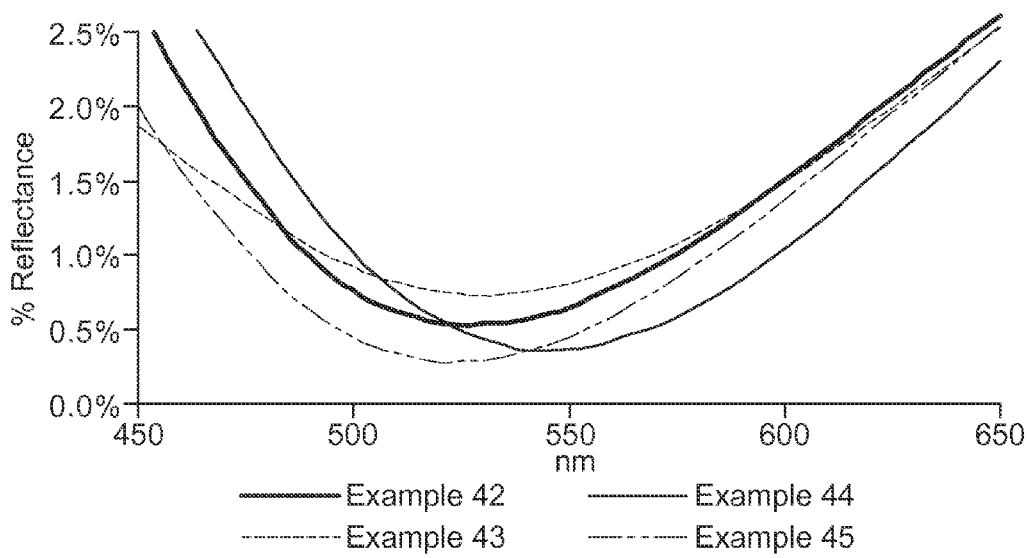
FIG. 6 are reflectance spectra of the samples prepared in Examples 41-44.

The reflectance spectra of coated sections of the films prepared in Examples 42-45 are included in FIG. 6. Removal of back surface reflection from the polyester substrate was accomplished by lightly abrading the back surface and applying black tape (Yamato Co., Japan).

Example 46

Two-Layer Antireflection Article Construction Tetra(ethoxy) Titanate and Methyltriacetoxy Silane A polyester substrate (DuPont 454 4-mil) was coated, in the following sequence, to form two-layer antireflection article constructions:

The first coater pass was an $H_2O$ plasma treatment at 0.3 Torr chamber pressure, 400 watts net power, 400 kHz, and at 40 fpm.

The second coater pass was deposition of tetra(ethoxy) titanate using the procedure of Example 2, with the following exception: the substrate speed was 16 fpm.

A second coating layer of methyltriacetoxy silane was later deposited onto the titanate layer. The methyltriacetoxy silane layer was deposited using the procedure of Example 12, with the following exception:

The substrate speed was 22.7 fpm.

After deposition of the two-layer construction, the coated substrate was treated in an oven for 24 hrs at 70° C.

Figure 7:
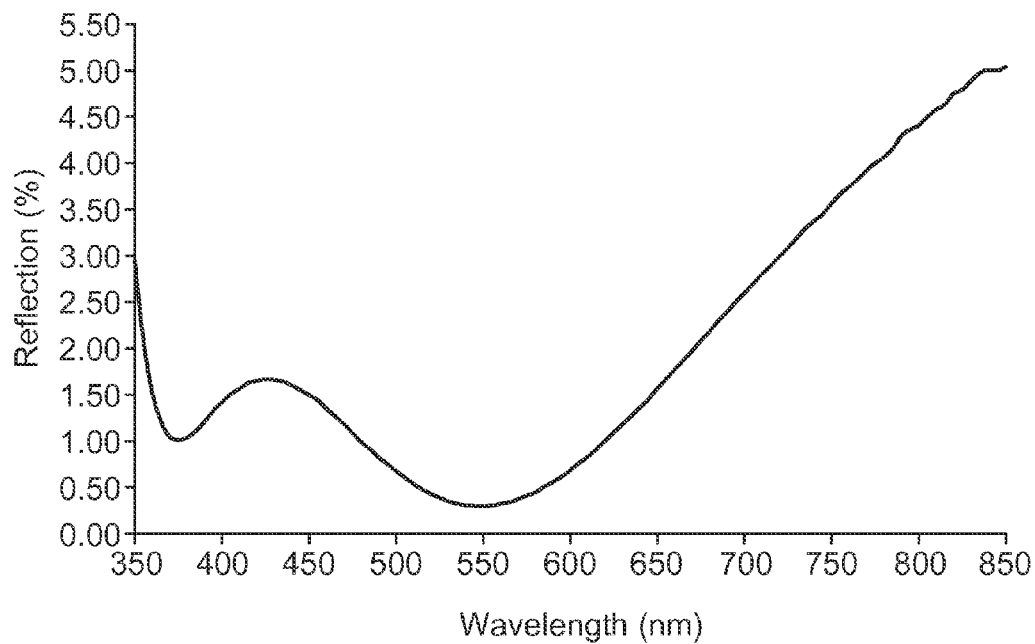
FIG. 7 is a reflectance spectrum of the sample prepared in Example 45.

The reflectance spectrum of the coated substrate is shown in FIG. 7. Removal of back surface reflection from the polyester substrate was accomplished by lightly abrading the back surface and applying black tape (Yamato Co., Japan).

Examples 47-53

Formation of Color-Shifting Articles

A polyester substrate (DuPont 454) was coated using the procedure of Example 18, with the following changes: In a third pass through the coater a layer of silver (~40 nm) was sputter-coated atop the titanate layer, completing a three layer chromium—titanate—silver optical stack which, when viewed from the uncoated side of the polyester substrate, exhibits reflected color. Table 9 summarizes the line speeds used during the titanate deposition passes for Examples 47-53.

TABLE 9

| Process Conditions. | | |
|---|---|---|
| Example | Sample location (ft.) | Fpm |
| 47 | 75 | 30 |
| 48 | 125 | 22 |
| 49 | 175 | 18 |
| 50 | 223 | 13 |
| 51 | 275 | 14 |
| 52 | 325 | 15 |
| 53 | 375 | 15 |

Figure 8:
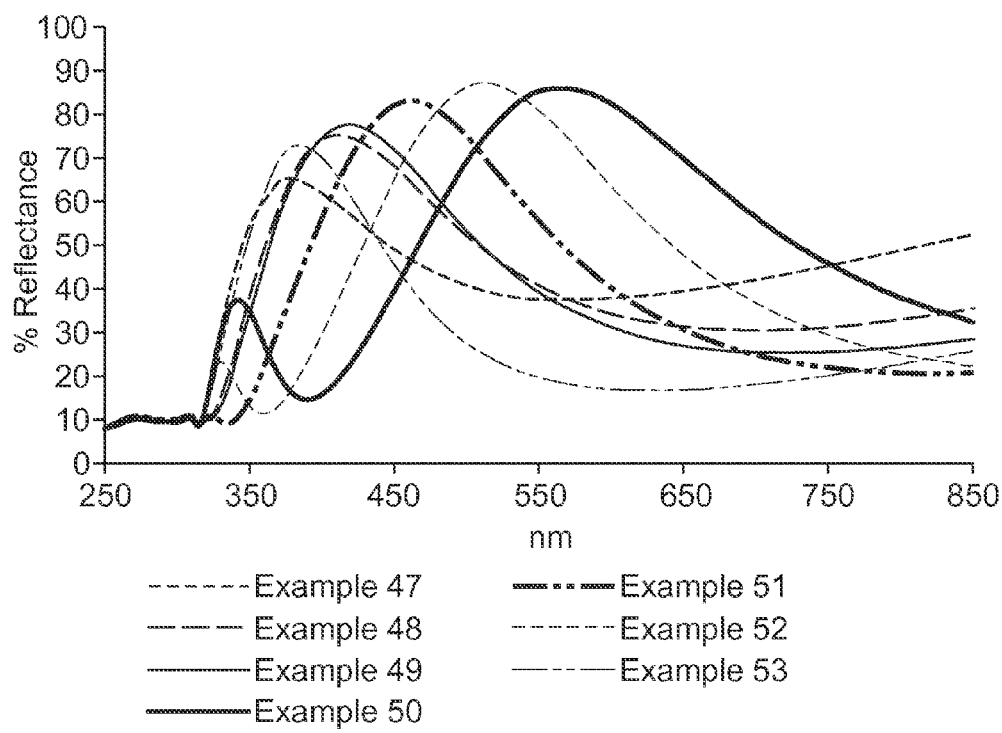
FIG. 8 are reflectance spectra of the samples prepared in Examples 46-52.

Reflectance spectra of Examples 47-53 are included in FIG. 8. The spectral appearance ("color") of the sections is primarily determined by the varied thickness of the titanate layer (controlled by substrate speed changes during titanate deposition).

Example 54

Fluorinated Polyether Coating

A fluorinated polyether oligomer functionalized with trimethoxy silane functional groups at each end and the general formula:

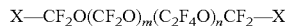

X—CF$_2$O(CF$_2$O)$_m$(C$_2$F$_4$O)$_n$CF$_2$—X where X=CONHCH$_2$CH$_2$CH$_2$Si(OCH$_3$)$_3$, m is about 10, n is about 10, and having an average molecular weight of about 2000 was used for coating a glass plate.

The fluorinated trialkoxysilane polyether oligomer was coated onto anti-reflectance coated (AR) glass (TDAR) from Viracon in a system shown schematically in FIG. 2. The oligomer was atomized and evaporated by the methods such as those described in U.S. Pat. No. 6,045,864. The liquid flow rate into the atomizer was 0.075 ml/min. The hot nitrogen flow into the atomizer was 44 lpm at a temperature of 186° C. The evaporator zone temperature was 162° C. The substrate was exposed to the vapor flow exiting the diffuser for 5 seconds to form a very thin, condensed liquid coating on the AR glass. The liquid film was cured by exposure to atmospheric water vapor in an oven at 110° C. for 5 minutes.

After curing, the coating had ink repellency (Sharpie® pen ink beaded up) and the ink was easily removed with a dry wipe. The durability of the coating was tested by mechanically rubbing the coating with 24 layers of cheese cloth (grade 90) under a weight of 1 kg for 2500 rub cycles. The coating maintained the ink repellency (Sharpie® pen ink beaded up) and the ink was easily removed with a dry wipe after the cheese cloth rubbing.

Example 55

Fluorinated Polyether Coating

A polycarbonate plate 12 inches×9 inches was coated with the fluorinated trialkoxysilane polyether oligomer, using the procedure of Example 54, with the following changes: the diffuser was replaced with a slot coating die 10 inches wide, the liquid monomer flow rate was 0.10 ml/min, the nitrogen flow to the atomizer was 50 lpm at 300° C., the evaporation zone temperature was 300° C., and the substrate was moved past the coating die slot at 1 inch/second. The liquid coating was cured by exposure to a hot flux of water vapor from a catalytic combustion source. The 12×4 inch catalytic burner (Flynn Burner Corp.) was supported by combustible mixture consisting of 385 ft$^3$/hr of dried, dust-filtered air and 40 ft$^3$/hr of natural gas, which provided a flame power of 40,000 Btu/hr-in. The flame equivalence ratio was 1.00. The gap between the catalytic burner and the coated substrate was about 2 inches. The exposure time was less than 2 seconds. After curing, the coating was repellent to solvent-based ink.

Example 56

Prepolymerization of Tetraisopropyl titanate

An oligomeric coating material is prepared according to the procedure described in DuPont, "*Versatile TYZOR Organic Titanates*", p 19, E-38961, by prepolymerizing tetraisopropyl titanate (Tyzor TPT, DuPont). An aqueous TYZOR TPT oligomer solution may be prepared as follows:

Add 10 weight parts TYZOR TPT to 20 weight parts of glacial acetic acid with agitation (some heat will be liberated) and add 70 weight parts of the water with agitation. Gelatinous agglomerates may form but with continued mild agitation are dissolved to provide a low viscosity oligomeric material. This oligomeric solution is stable for several days at room temperature. Subsequent aqueous dilutions are easily made. If excessive turbidity develops the oligomeric solution should be discarded. The oligomeric solution, oligomeric mixture A, includes prepolymerized titanates, unpolymerized tetraisopropyl titanate, isopropyl alcohol, water and acid.

Example 57

Coating with Prepolymerized Tetraisopropyl Titanate

A thin film of the oligomeric mixture A prepared in Example 55 is formed using a coater (100) similar to that illustrated schematically in FIG. 1, having an extrusion slot die applicator (not shown in FIG. 1). A sample film substrate is attached to the temperature controlled process drum. The substrate is a 4-mil thick, 18-inch wide polyester (DuPont 454). In the first pass (drum rotation), the substrate is plasma treated with a water vapor plasma set at 0.3 Torr, operating at 400 kHz and a net power of 400 W (1 drum revolution). The oligomeric material is degassed. After degassing, oligomeric material is loaded into a pressure cylinder. The loaded pressure cylinder is connected to the extrusion coater. The oligomeric material is pumped through the slot die applicator, which deposits a film of the oligomeric material on the substrate surface. The sample is rotated past the extrusion coating die for 1 revolution. Then the chamber pressure is increased to 8 Torr (with a set flow of 3000 sccm water vapor and 210 sccm nitrogen). The sample is exposed to this continuous flow of water vapor for 30 minutes.

Example 58

A polyester substrate (DuPont 454) is coated using the procedure described in Example 56, with the following changes: The process drum temperature is set to 70° C. (158° F.). The chamber pressure is maintained at 1.0 Torr. The first pass plasma pretreatment gas is nitrogen.

Example 59

A polyester substrate (DuPont 454) is coated using the procedure described in Example 55, with the following changes: The coating material is a degassed mixture of tetra(isopropyl) titanate (DuPont Tyzor TPT) and tetradecane. The process drum temperature is set at 17° C. (63° F.). The coater is operated in the roll-to-roll mode. The first pass plasma pretreatment gas is nitrogen. After coating, the tetra(isopropyl) titanate and tetradecane film is immediately exposed to water vapor in the vacuum chamber to cure the coating while the tetradecane slowly evaporates. A continuous flow of distilled water vapor is introduced into the chamber from a water vapor mass flow meter.

Example 60

A polyester substrate (DuPont 454) is coated using a vapor coater similar to the coater illustrated schematically in FIG. 1. A plasma (e.g., a glow discharge, not shown in FIG. 1) containing the organometallic vapor (tetra(isopropyl) titanate) is produced, which exits from the evaporator and is condensed on the substrate. The process drum temperature is set at 17° C. (63° F.). The evaporator temperature is set at 100° C. The condensed film is cured as described above.

Example 61

A polyester substrate (DuPont 454) is coated using the procedure of Example 60, with the following changes: The plasma containing both the tetra(isopropyl) titanate (organometallic) vapor and degassed tetraethyleneglycoldiacrylate vapor, exits from the evaporator and is condensed on the substrate. The condensed film is cured as described above.

Example 62

A polyester substrate (DuPont 454) is coated using the procedure of Example 60, with the following changes: The plasma containing both the tetra(isopropyl) titanate (organometallic) vapor and degassed tetraethyleneglycoldiacrylate vapor, exits from the evaporator and is condensed on the substrate and cured as described above.

Example 63

The condensed film receives a limited cure in which the organometallic coating material is not fully reacted. During use, the barrier film will be exposed to atmospheric moisture, which will slowly diffuse through the coating and become chemically bonded to unreacted sites, reducing the out diffusion of water. The coating will thus have improved water vapor barrier properties through this gettering mechanism.

Example 64

Prepolymerization of Tetraethoxytitanate

An oligomeric coating material can be prepared by prepolymerizing Tyzor ET (DuPont) prior to evaporation and coating. Ethanol and all glassware are purified to remove residual water, as described in D. C. Bradley, et. al, "*The Hydrolysis of Titanium Tetraethoxide*", *J. Chem. Soc.* (1955) 721-726. In a nitrogen-purged glovebox, a solution of water (1.0 g) in ethanol (30 g) is added dropwise with magnetic stirring to a solution of Tyzor ET (30.0 g) in ethanol (125 g) at room temperature. The solvent (ethanol) is evaporated until 37 g of solution remains. This solution, oligomeric mixture B, consists of prepolymerized Tyzor ET and unpolymerized Tyzor ET with approximately 30% (wt) solvent (ethanol).

Example 65

Prepolymerization of Tetra(n-propoxy)zirconate

An oligomeric coating material is prepared by prepolymerizing Tyzor NPZ (DuPont) using the procedure in Example 64, except that n-propanol is used as the solvent and Tyzor NPZ is used as the metal alkoxide. The water solution is made of 0.5 g of water and 30 g of n-propanol. The zirconate solution is made of 35 g Tyzor NPZ (contains 28 wt % propanol) and 180 g of n-propanol. After reaction at room temperature, the solvent (n-propanol) is evaporated until 45 g of solution remains. This solution, oligomeric mixture C, consists of prepolymerized tetra(n-propoxy)titanate and unpolymerized tetra(n-propoxy)titanate with approximately 50% (wt) solvent (n-propanol).

Example 66

Coating of Prepolymerized Tetraethoxytitanate

A thin film is formed from oligomeric mixture B (Example 64) using a vapor coater similar to the coater illustrated schematically in FIG. 1. The substrate is a 4-mil thick, 18-inch wide polyester (DuPont 454). However, the sample film is attached to the temperature controlled process drum rather than run in roll-to-roll mode. In the first pass (drum rotation), the substrate is plasma treated with water vapor plasma at 0.3 Torr, operating at 400 kHz, a net power of 400 W with the process drum rotating for 1 drum revolution with the sample passing the plasma source at 40 fpm.

Oligomeric mixture B is handled in a nitrogen-purged glove box with an attached vacuum bell jar. Oligomeric mixture B is dispensed into a glass jar and placed into the vacuum bell jar for degassing. The bell jar is evacuated. After degassing, the bell jar is vented in nitrogen and the liquid loaded into a syringe without exposure to atmospheric moisture. The syringe is mounted on a syringe pump and connected to an atomizer/evaporator system as described in PCT International Publication No. WO 2008/030262. For the second drum rotation, the oligomeric mixture is pumped to the atomizer at a flow rate of 1.0 ml/min. The flow rate of nitrogen gas to the atomizer is 15 sccm. Oligomeric mixture B is atomized into fine droplets and flash evaporated when the droplets contact the hot evaporator wall surface (340° C.). The vapor flow exits a 16-inch-wide coating die and the oligomeric material condenses on the substrate. After stabilization of the atomization and evaporation process, the sample is rotated past the vapor coating die at a linear speed of 15 fpm for 1 revolution to condense the liquid layer of oligomeric mixture B. Then the chamber pressure is increased to 8 Torr (with a flow of 3000 sccm water vapor and 210 sccm nitrogen). The sample is exposed to this continuous flow of water vapor for 30 minutes.

Example 67

Coating with Prepolymerized Tetraethoxytitanate and Darocur 1173

A polyester substrate (DuPont 454, 4-mil) is coated, as described in Example 66, with the following changes: Two syringes and syringe pumps are used, one containing oligomeric mixture B (Example 64) and the other containing Darocur 1173 (Ciba). The liquid streams from the two syringes are kept separate. Each liquid stream is directed to a separate atomizer mounted in separate evaporators. The flow of the oligomeric mixture B material is 0.85 ml/min and the flow of the Darocur 1173 material is 0.15 ml/min. The evaporated oligomeric mixture B metal alkoxide and Darocur 1173 are mixed as vapors and exit one coating die prior to condensation onto the substrate. The drum temperature during the deposition is 15° C. The nitrogen flow into each atomizer is 10 sccm. After the deposition, the drum is heated to 70° C. prior to increasing the chamber pressure to 8 Torr.

Example 68

Coating of Prepolymerized tetra(n-propoxy)titanate

A polyester substrate (DuPont 454) is coated using the procedure of Example 66, except that oligomeric mixture C (Example 65) is used as the coating material.

The coated PET substrates prepared in examples 57-63 and 66-68, with the cured layers, will have a lower water vapor or oxygen transmission rates than that of the uncoated PET substrates.

All references cited herein are expressly incorporated herein by reference in their entirety into this disclosure. Illustrative embodiments of this disclosure are discussed and reference has been made to possible variations within the scope of this disclosure. These and other variations and modifications in the disclosure will be apparent to those skilled in the art without departing from the scope of the disclosure, and it should be understood that this disclosure and the claims shown below are not limited to the illustrative embodiments set forth herein.

We claim:

1. A method for forming a barrier film comprising a hybrid organic/inorganic layer on a substrate, which method comprises:
    forming under a vacuum a first metal alkoxide layer atop the substrate, the first metal alkoxide layer comprising an organometallic copolymer formed by reaction of a metal alkoxide compound with an organic compound, wherein the metal alkoxide compound or both the metal alkoxide compound and the organic compound is vaporized, passed proximate a glow discharge electrode to form a plasma, and condensed on the substrate from the plasma; and
    reacting the organometallic copolymer with water to cure the first metal alkoxide layer under the vacuum to form the first hybrid organic/inorganic layer on the substrate, wherein the resulting barrier film has an oxygen transmission rate at ambient pressure less than 1 cc/m$^2$-day, and a water vapor transmission rate at ambient pressure less than 10 g/m2-day.

2. The method of claim 1, wherein both the metal alkoxide compound and the organic compound are vaporized, passed proximate a glow discharge electrode to form the plasma, and condensed on the substrate from the plasma.

3. The method of claim 1, wherein the water is in the form of water vapor, liquid water, or a plasma containing the water.

4. The method of claim 1, further comprising exposing the first hybrid organic/inorganic layer to a heat treatment.

5. The method of claim 1, wherein the metal alkoxide compound comprises an alkoxide of aluminum, antimony, arsenic, barium, bismuth, boron, cerium, gadolinium, gallium, germanium, hafnium, indium, iron, lanthanum, lithium, magnesium, molybdenum, neodymium, phosphorus, silicon, sodium, strontium, tantalum, thallium, tin, titanium, tungsten, vanadium, yttrium, zinc, zirconium or a mixture thereof.

6. The method of claim 1, further comprising forming a polymer layer atop the first hybrid organic/inorganic layer.

7. The method claim 6, comprising forming additional alternating polymer and inorganic or hybrid layers atop the first hybrid organic/inorganic layer.

8. The method of claim 7, further comprising coating one or both surfaces of the substrate with a second hybrid inorganic/organic layer to provide optical functionality.

9. The method of claim 6, further comprising forming a protective polymer layer atop the polymer layer and the first hybrid organic/inorganic layer, optionally wherein the protective polymer comprises a polyacrylate.

10. A method for forming a barrier film comprising a hybrid organic/inorganic layer on a substrate, which method comprises:
    forming under a vacuum a liquid layer comprising a metal alkoxide compound, water and an organic compound to form a first hybrid layer atop the substrate, wherein at least one of the metal alkoxide compound or the organic compound is vaporized, passed proximate a glow discharge electrode to form a plasma, and condensed on the substrate from the plasma; and
    curing the first hybrid layer to form an organometallic copolymer by reacting the metal alkoxide compound with the water and the organic compound on the substrate under the vacuum, wherein the resulting barrier film has an oxygen transmission rate at ambient pressure less than 1 cc/m$^2$-day, and a water vapor transmission rate at ambient pressure less than 10 g/m$^2$-day.

11. The method of claim 10, wherein curing the first hybrid layer comprises contacting the metal alkoxide compound with the water in the form of water vapor.

12. The method of claim 10, wherein forming a liquid layer comprises vaporizing the metal alkoxide compound and the organic compound, and condensing the vaporized metal alkoxide compound and the vaporized organic compound as a liquid on the substrate.

13. The method of claim 12, wherein the metal alkoxide compound and the organic compound are vaporized separately and mixed in the vapor phase before condensing on the substrate.

14. The method of claim 10, wherein forming a liquid layer comprises applying a liquid comprising the water to the substrate.

15. The method of claim 10, wherein the water is vaporized, passed proximate a glow discharge electrode to form a plasma, and condensed on the substrate from a plasma.

16. The method of claim 10, wherein the organic compound comprises an alcohol, carboxylic acid, ester, acid anhydride, acetyl halogen, thiol, or amine.

17. The method of claim 10, further comprising forming a polymer layer atop the hybrid organic/inorganic layer.

18. The method of claim 17 further comprising forming additional alternating polymer and hybrid organic/inorganic layers atop the hybrid organic/inorganic layer.

19. The method of claim 10, further comprising coating one or both surfaces of the substrate with a second hybrid inorganic/organic layer to provide optical functionality.

* * * * *